US007616492B2

(12) United States Patent
Kern et al.

(10) Patent No.: US 7,616,492 B2
(45) Date of Patent: Nov. 10, 2009

(54) EVALUATION CIRCUIT AND EVALUATION METHOD FOR THE ASSESSMENT OF MEMORY CELL STATES

(75) Inventors: Thomas Kern, Munich (DE); Thomas Mikolajick, Dresden (DE); Jan-Malte Schley, Munich (DE)

(73) Assignees: Qimonda AG, Munich (DE); Qimonda Flash GmbH & Co. KG, Dresden (DE)

( * ) Notice: Subject to any disclaimer, the term of this patent is extended or adjusted under 35 U.S.C. 154(b) by 0 days.

(21) Appl. No.: 11/543,306

(22) Filed: Oct. 4, 2006

(65) Prior Publication Data

US 2007/0086241 A1 Apr. 19, 2007

(30) Foreign Application Priority Data

Oct. 4, 2005 (DE) .................. 10 2005 047 407
May 11, 2006 (DE) .................. 10 2006 022 071
May 11, 2006 (DE) .................. 10 2006 022 072

(51) Int. Cl.
 *G11C 11/34* (2006.01)
(52) U.S. Cl. ..................... 365/185.18; 365/185.24
(58) Field of Classification Search ............ 365/185.18, 365/185.24
See application file for complete search history.

(56) References Cited

U.S. PATENT DOCUMENTS

| | | | | |
|---|---|---|---|---|
| 5,642,463 A * | 6/1997 | Nakano et al. | ............... | 704/201 |
| 5,864,496 A * | 1/1999 | Mueller et al. | ................ | 365/69 |
| 6,369,855 B1 * | 4/2002 | Chauvel et al. | .......... | 348/423.1 |
| 6,448,887 B1 * | 9/2002 | Martin et al. | ............ | 340/309.4 |
| 6,469,882 B1 * | 10/2002 | Tignor | ........................ | 361/93.1 |
| 6,947,315 B2 * | 9/2005 | Iwata | ......................... | 365/158 |
| 7,177,190 B2 * | 2/2007 | Lee | ........................ | 365/185.17 |
| 2002/0101778 A1 * | 8/2002 | Khan | .................... | 365/230.03 |
| 2005/0195650 A1 | 9/2005 | Deppe et al. | | |
| 2006/0227018 A1 * | 10/2006 | Ejima et al. | ................... | 341/50 |

* cited by examiner

*Primary Examiner*—Michael T Tran
(74) *Attorney, Agent, or Firm*—Slater & Matsil, L.L.P.

(57) ABSTRACT

An electronic circuit arrangement includes a storage unit set up for storing at least two analog electrical quantities. A first evaluation circuit is coupled to the storage unit and is set up in such a way that it assesses the at least two analog electrical quantities and provides a first assessment result. A second evaluation circuit is coupled to the storage unit and is set up in such a way that it assesses at least one of the at least two analog electrical quantities with a predetermined threshold value and provides a second assessment result.

29 Claims, 13 Drawing Sheets

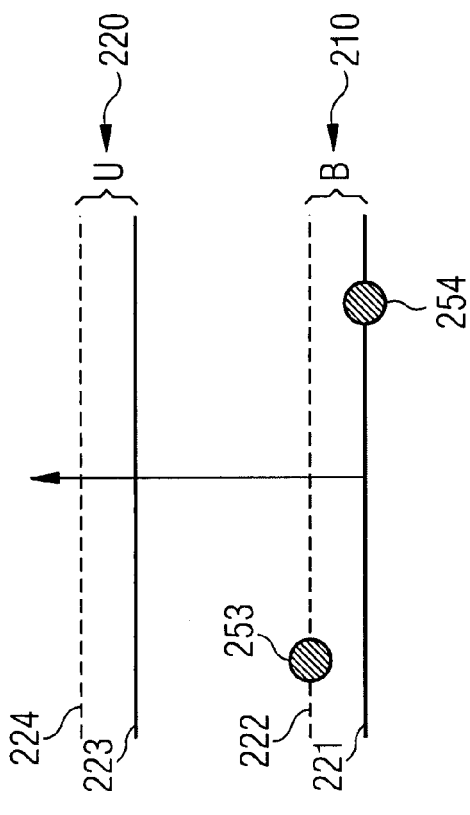
FIG 2B
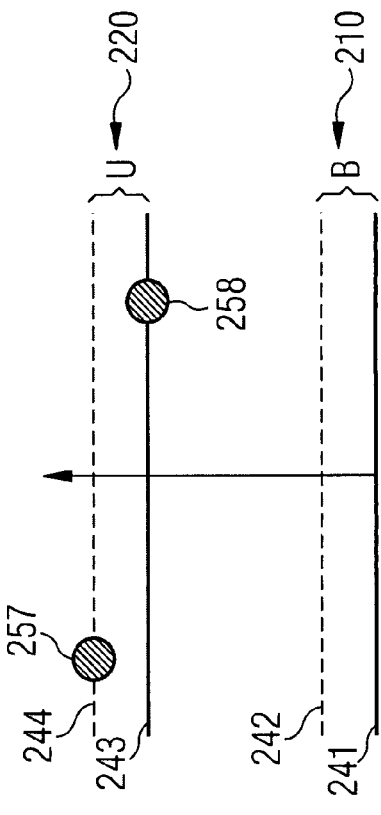
FIG 2D
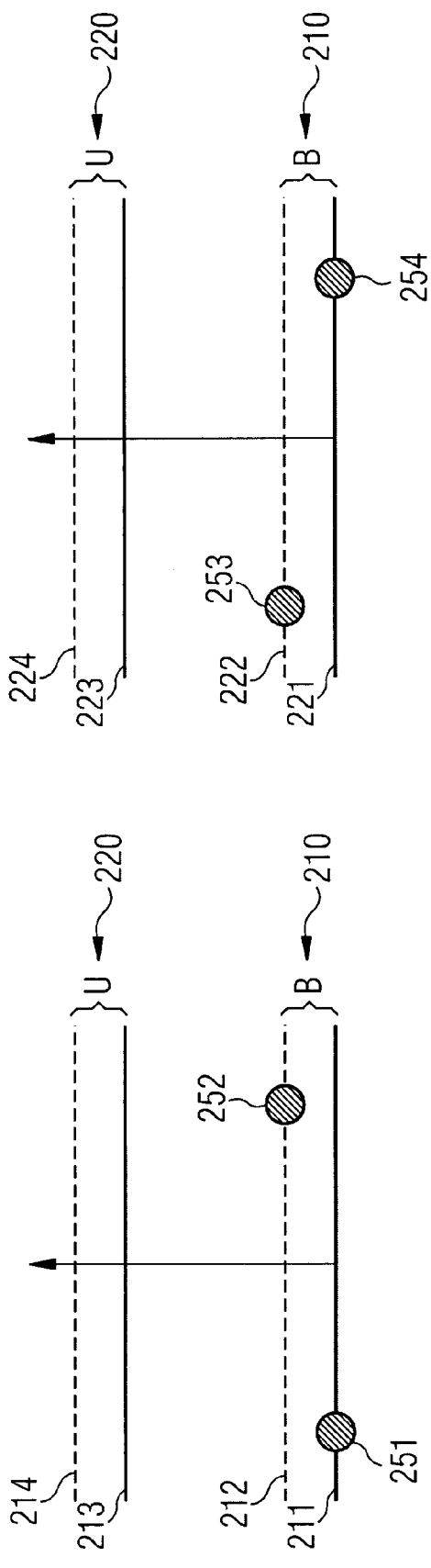
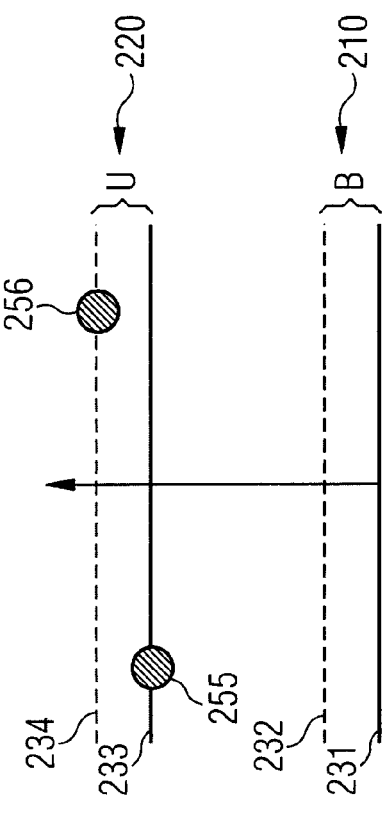
FIG 2A
FIG 2C

EVALUATION CIRCUIT AND EVALUATION METHOD FOR THE ASSESSMENT OF MEMORY CELL STATES

This application claims priority to German Patent Application 10 2005 047 407.1, which was filed Oct. 4, 2005, and to German Patent Application 10 2006 022 071.4, which was filed May 11, 2006, and to German Patent Application 10 2006 022 072.2, which was filed May 11, 2006, all of which applications are incorporated herein by reference.

TECHNICAL FIELD

The present invention relates generally to semiconductors, and in a particular embodiment to an evaluation circuit and evaluation method for the assessment of memory cell states.

BACKGROUND

In the case of electrically writeable and erasable memories, a distinction is made between volatile and non-volatile memory cells. Non-volatile memory cells also include, by way of example, a so-called charge-trapping memory cell, which may be used, e.g., in a virtual ground NOR architecture and the construction of which is modified on the basis of a MOS field effect transistor (MOSFET), to the effect that a gate insulation layer has, for example, a layer stack having three layers. In the case of charge-trapping memory cells, typically an electrically non-conductive middle layer of the three layers is provided for trapping and storing charge carriers and the outer boundary layers prevent the charge carriers from flowing away from the middle layer, which is also referred to as the storage layer.

By means of suitable programming operating modes, in the case of the memory cell, charge carriers can be introduced into the storage layer in a defined manner in order to alter the electrical behavior of the memory cell in read operation. This programming of the memory cell 100 results in different charge states of the memory cell, which can be assigned equivalently to different logic states and can also be read out again in suitable read operation of the memory cell.

When a voltage is applied between the control gate and the substrate in read operation of the memory cell, the presence of charges in the storage layer alters the vertical electric field in the channel region in comparison with the state of the memory cell in which no charges are present in the storage layer. The vertical electric field in the channel region that results from the applied voltage and the electric field of the charge carriers in the case of an electrically charged storage layer alters the operating behavior of the memory cell in comparison with the operating behavior in the case of an uncharged storage layer. This is shown, e.g., by the fact that the threshold voltage $V_T$ of the transfer characteristic curve of this modified MOSFET arrangement is shifted to higher values when negative charge carriers are introduced. Correspondingly lower threshold voltages result when positive charge carriers are introduced.

A memory cell constructed in this way is also referred to as a SONOS memory cell (semiconductor-oxide-nitride-oxide semiconductor).

In the case of this memory cell, the boundary layers are usually embodied as oxide and the storage layer is usually embodied as nitride of the semiconductor material, usually silicon.

Alongside other methods, charge-trapping memory cells are programmed by means of so-called hot electrons (channel hot electrons, CHE) by introduction of electrons into the storage layer during programming, and can be erased, e.g., by means of so-called hot holes in that the negatively-charged electrons in the storage layer are compensated for by means of positively-charged holes.

A SONOS memory cell provided for a specific operating mode with a read voltage applied in the opposite sense to the programming operation (reverse read) and with a thickness of the boundary layers that is adapted to this operating mode is usually referred to as an NROM memory cell. The NROM memory cell is typically constructed symmetrically with regard to a first source/drain region and a second source/drain region. The NROM memory cell can be operated in at least two different operating modes from which at least two electrical quantities can be derived. These operating methods typically differ in the direction of the electrical voltages that are applied to the source/drain regions during the reading and programming of the memory cell.

By means of these two operating modes it is possible to program the memory cell into four different charge states and thus to store two bits since, in the case of programming operation in the first operating direction, from the first source/drain region to the second source/drain region, the charges are stored in the storage layer in a second charge storage region in the vicinity of the second source/drain region and, in the case of symmetrically reversed operation in the second operating direction, that is to say from the second source/drain region to the first source/drain region, charges are stored in the storage layer in the first charge storage region in the vicinity of the first source/drain region. During reading, the memory cell can be operated in such a way that the derived electrical quantities react particularly sensitively to charges present in one of the two charge storage regions of the charge storage layer and it is thus possible to define, e.g., four different logic states for storing two bits.

However, the introduction of charges into the first charge storage region, e.g., in the vicinity of the first source/drain region of such a memory cell causes alterations when reading out the electrical quantity during the operation of the memory cell in the second operating direction for detecting the amount of charge in the second charge storage region in the vicinity of the second source/drain region of the memory cell, and correspondingly vice versa.

This so-called crosstalk has a more pronounced effect, the greater the difference between the amounts of charge in the storage layer in the vicinity of the two source/drain regions. This crosstalk is reduced by means of suitable operating parameters such as, e.g., a higher voltage between the source/drain regions. However, as the technology is developed further, the effective channel length becomes smaller and, consequently, so does the physical distance between the charges on the two sides of a cell. This leads to greater crosstalk. It can, therefore, be expected that this crosstalk will cause problems during operation (in particular during read-out) to an increased extent in the future.

As described in US Application Publication No. 2005/0195650, crosstalk can be prevented, or greatly reduced, by means of altered operation of the memory cell.

In the case of this differential memory concept, greatly different amounts of charge at the two storage locations are avoided by virtue of the fact that the charge states are no longer directly assigned to the logic states, because the above-mentioned large differences in the amounts of charge between the two storage locations can arise with direct assignment.

In order to avoid this, the differential memory concept involves defining, e.g., two charge amount ranges that are small compared with the total charge amount range available for the programming of the memory cell. The charge states in the two charge storage regions are then either in an upper charge amount range, which is produced, e.g., by means of the difference between two upper charge states, or in a lower charge amount range, which is produced, e.g., by means of the difference between two lower charge states.

The two further logic states are then produced by means of programming in such a way that the charge states of the two charge storage regions differ in terms of magnitude by means of a value within one of the two defined charge amount ranges. The two further logic states are then produced by means of the sign of the difference when operating the memory cell in two different operating modes, e.g., by means of the channel region being operated in a first direction and by means of the channel region being operated in a second direction.

The effect of crosstalk is minimized with this programming by virtue of the fact that there are never large differences in the amounts of charge of the two charge storage regions or resulting threshold voltage differences during operation in the two operating modes. The threshold voltage of the memory cell serves as one example of an electrical quantity to be determined, which results from the charge states.

For determining the charge states of the memory cells, the at least two electrical quantities that result from the charge states in the at least two different operating modes of the memory cells are sequentially determined and provided since, in the case of the differential memory concept, at least one of the states results from the difference between the electrical quantities.

An evaluation circuit arrangement and an evaluation method for the assessment of electrical quantities provided that result from a memory operating concept with a varying mode of operation are required.

SUMMARY OF THE INVENTION

An electronic circuit arrangement is specified, having a storage unit set up for storing at least two analog electrical quantities. The storage unit is coupled to a first evaluation circuit and is set up in such a way that it assesses the at least two analog electrical quantities and provides a first assessment result. A second evaluation circuit is coupled to the storage unit and is set up in such a way that it assesses at least one of the at least two analog electrical quantities with a predetermined threshold value and provides a second assessment result.

A method for determining a state of a storage unit in which at least two analog electrical quantities are stored is provided. By means of a first evaluation circuit, a difference between the at least two analog electrical quantities of the storage unit is assessed and at least one first assessment result is provided.

A computer program product for determining a state of a storage unit is specified, which, when it is executed by a processor, stores at least two analog electrical quantities in a storage unit. By means of a first evaluation circuit, a difference between the at least two analog electrical quantities of the storage unit is assessed and at least one first comparison result is provided. By means of a second evaluation circuit, at least one of the at least two analog electrical quantities of the storage unit is assessed with a threshold value and at least one second comparison result is provided.

An electronic circuit arrangement is specified having a storage means set up for storing at least two analog electrical quantities. A first evaluation means coupled to the storage means is used to assess the at least two analog electrical quantities and to provide a first assessment result. A second evaluation means coupled to the storage means is used to assess at least one of the at least two analog electrical quantities with a predetermined threshold value and to provide a second assessment result.

BRIEF DESCRIPTION OF THE DRAWINGS

Exemplary embodiments of the invention are illustrated in the figures and are explained in more detail below. In the figures:

FIG. 2 shows an illustration of the charge states and charge state ranges for storing four states in the differential memory concept of a non-volatile memory cell;

DETAILED DESCRIPTION OF ILLUSTRATIVE EMBODIMENTS

Figure 1:
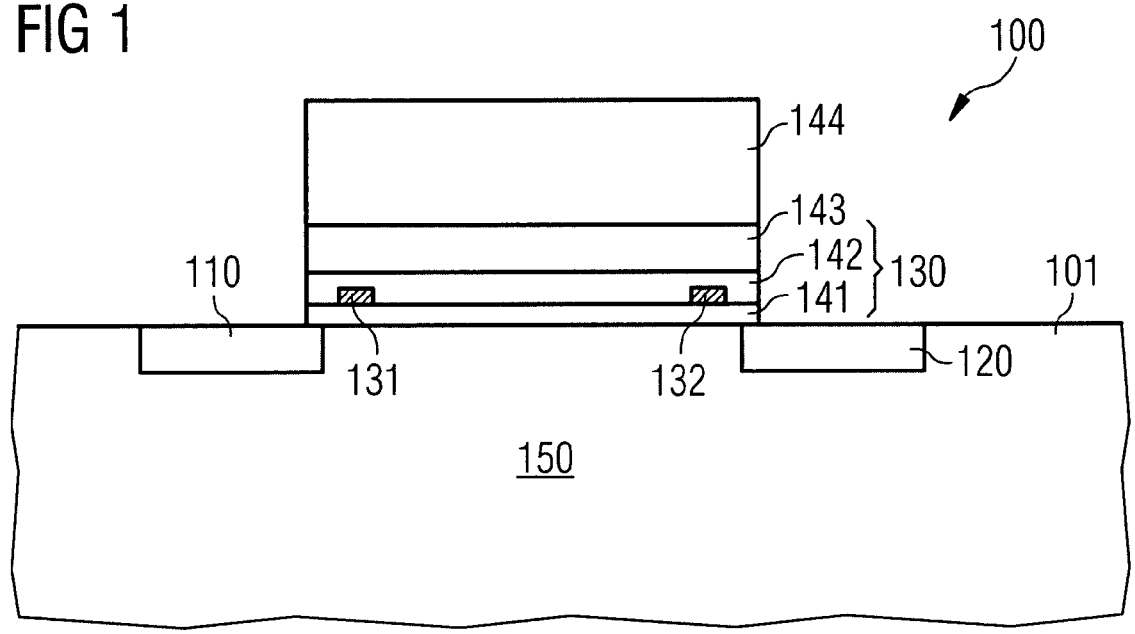
FIG. 1 shows an illustration of an example of the construction of an NROM memory cell.

The electronic evaluation circuit arrangement has a storage unit, which is set up in such a way that it can store at least two analog electrical quantities.

The storage unit may be realized by combining a plurality of partial storage units such as, e.g., at least two electrical capacitors in such a way that the storage unit as a whole can store a sufficient number of electrical quantities. Further possibilities for storing the electrical quantities that are read out may be implemented both with volatile memory elements, such as, e.g., DRAMs, and with circuit arrangements such as, for example, flip-flops, registers and latches. A first evaluation circuit is coupled to the storage unit, the first evaluation circuit being set up in such a way that it assesses the at least two analog electrical quantities and provides a first assessment result.

The coupling of the storage unit to the first evaluation circuit and also/or else to further evaluation circuits may be effected by a coupling unit, which couples the electrical quantities provided by the storage unit to the evaluation circuits, converts them into other electrical quantities or converts the at least two electrical quantities of the storage unit in an analog manner such that further electrical quantities such as, e.g., a summation current are provided.

The first evaluation circuit may be embodied in the form of a comparison circuit such as a differential amplifier, for example, by means of the at least two electrical quantities acting on the inputs of the differential amplifier in such a manner that the output signal of the differential amplifier represents the assessment result.

As an alternative, the first evaluation circuit may also be realized by at least one flip-flop circuit, on the inputs of which the at least two electrical quantities act in such a way that the switching state of the flip-flop assumes one of at least two states depending on the at least two electrical quantities, and the associated resulting electrical quantities that occur at suitable nodes of the circuit thus represent the assessment result.

The flip-flop circuit may be constructed, e.g., by means of two cross-coupled inverter circuits.

The assessment result of the first evaluation unit is present as a defined level at the output of the first evaluation unit, the level being defined by the parameters of the electrical circuit arrangement both, e.g., in the embodiment with the differential circuit as comparison circuit and, e.g., in the embodiment by means of the flip-flop as comparison circuit.

As an alternative, the two terminals of the flip-flop assessment circuit are forced to a uniform potential in a manner triggered by a control unit, which acts on an equilibrium FET, prior to each new assessment of the state of the storage unit, by means of the equilibrium FET, in order to ensure a reliable changeover of the flip-flop assessment circuit.

A second evaluation circuit is coupled to the storage unit, the second evaluation circuit being set up in such a way that it assesses at least one of the at least two analog electrical quantities with a predetermined threshold value and provides a second assessment result.

In this case, the at least one electrical quantity of the storage unit can be converted into at least one other analog electrical quantity by means of the coupling unit that couples at least one of the at least two evaluation units and the storage unit.

The coupling unit may also be modified such that it forms at least one other electrical quantity from at least two electrical quantities. By way of example, the coupling unit may be used to provide a summation voltage from at least two electrical quantities of the storage unit in the form of electrical voltages.

For this purpose, the at least two voltages of the storage unit are converted into currents, the currents are electrically combined at a point and a summation voltage is provided by means of a current-voltage conversion. Due to nonlinearities in the conversion, the summation voltage may possibly deviate from an arithmetic sum in this case.

The modifications of the coupling unit for forming analog electrical quantities from the at least two electrical quantities of the storage unit and the feeding of the electrical quantities from the storage unit to the evaluation units depend on the advantageous operating mode of the memory element and can easily be correspondingly adapted.

The assessment by means of the second evaluation unit may be effected by means of a Schmitt trigger circuit by virtue of a voltage at the input of the evaluation circuit acting on the Schmitt trigger circuit and, according to the magnitude of the voltage the Schmitt trigger circuit putting the output of the Schmitt trigger circuit at a high or a low potential.

As an alternative, the assessment of the second evaluation unit may also be effected by means of a differential circuit by virtue of the electrical quantity to be assessed acting on one of the at least two inputs of the differential circuit from the coupling unit and a reference voltage acting on the second input of the differential circuit.

The assessment result is then provided by the comparison of the two voltages and the output voltage of the differential circuit that results from this, which output voltage is then coupled to the output of the second evaluation circuit.

The assessment result of the second evaluation circuit is present as a defined level at the output of the second evaluation unit, the level being defined by the parameters of the second evaluation circuit of the electrical circuit arrangement. This holds true in particular both for the embodiment by means of the differential circuit and for the embodiment by means of the Schmitt trigger.

By modifying parts of the circuit arrangement, e.g., the coupling unit, in a form such that the electrical quantity is fed to the second evaluation unit only from one partial storage unit, the second evaluation unit can assess the comparison result of one of the at least two electrical quantities or, by means of a second modification of the circuit arrangement by forming, e.g., the sum of the electrical quantities, e.g., by means of the coupling unit, electrical quantities that are derived from the at least two electrical quantities of the storage unit can be assessed.

The threshold value or trigger point of the second evaluation unit can be set by means of the electrical parameters of the Schmitt trigger circuit if a Schmitt trigger is used for the comparison circuit. If a differential circuit is used for the comparison circuit, the threshold value or the trigger point can be set by means of the reference voltage or comparison voltage at one of the at least two inputs of the differential circuit.

Since the electrical quantity of the storage unit is coupled both to the first evaluation unit and to the second evaluation unit, the assessment result may be affected simultaneously with regard to the assessment criteria of the first evaluation unit and of the second evaluation unit. The first comparison result and the second comparison result are thus present simultaneously in digitized form at the outputs of the first evaluation circuit and of the second evaluation circuit.

The storage unit of the electronic circuit arrangement is constructed in such a way that it can be fed, by means of an interface, at least two analog electrical quantities that result from the operation of at least one memory element, e.g., in two different operating directions.

The analog electrical quantities that result from the at least two operating modes of the memory element can be read into the storage unit.

By means of this coupling of the memory element to the storage unit, the electrical quantities that result from the operating modes of the memory element can be buffer-stored by means of the storage unit.

A method for determining a state of a storage unit in which at least two analog electrical quantities are stored is furthermore provided. In this method, by means of a first evaluation circuit, a difference between the at least two analog electrical quantities is assessed and at least one first assessment result is provided.

Furthermore, in a method, by means of a second evaluation circuit, at least one of the at least two analog electrical quantities of the storage unit is assessed with a threshold value and at least one second assessment result is provided.

The first assessment result and the second assessment result represent the state of the storage unit and the first assessment result and the second assessment result are provided in digitized form.

The assessment of the at least two analog electrical quantities is performed simultaneously with the aid of the first evaluation circuit and the second evaluation circuit. The results of the comparisons are thereby available simultaneously for further data processing. Due to the simultaneous assessment according to this method, the assessment result is more robust with respect to alterations of the voltage supply or of reference voltages.

The storage of the electrical quantities by means of the storage unit, which comprises at least two partial storage units, is effected by means of the charge state of an analog electrical quantity from at least one capacitor per partial storage unit.

The sum of the at least two electrical quantities of the storage unit is assessed by means of the second evaluation circuit. The sum of the at least two electrical quantities is compared with a reference value by means of the second evaluation unit. As an alternative, according to an optimized mode of operation of the at least one memory element, the method may also assess an individual value of the at least two analog electrical quantities with a threshold value by means of the second evaluation circuit.

If required by the optimized mode of operation of the memory element, it is also possible for a different analog electrical quantity formed from the at least two electrical quantities to be assessed by the second evaluation circuit by means of this analog electrical quantity formed being compared with a reference value.

The reference value for the assessment by means of the second evaluation circuit may be predetermined by means of an interface of the second evaluation circuit. In this case, the assessment of the electrical quantity of the second evaluation circuit is achieved by means of a difference forming circuit.

As an alternative, the reference value is set by a trigger point, which can be altered by a choice of electrical parameters, e.g., a Schmitt trigger circuit, which carries out the assessment of the electrical quantity of the second evaluation circuit. In this case, the assessment of the second evaluation circuit is performed by means of a Schmitt trigger circuit.

The determination of the difference between the at least two electrical quantities that are provided by the storage unit is performed by means of the first evaluation unit. The determination of the difference between the at least two electrical quantities is performed by means of two inverters. The flip-flop that can be formed from these two inverters by cross-coupling assumes a first or a second state depending on the magnitude of the current at its terminals. The assessment result is represented by the level of the voltage at one of the terminals.

The coupling of the storage unit to at least one of the evaluation units is achieved by means of a coupling unit. This coupling unit forms at least one formed electrical quantity from the at least two electrical quantities of the storage unit before the formed electrical quantity is fed to one of the evaluation units. In particular, electrical voltages are converted into currents in this way.

For the assessment of the sum of the at least two electrical quantities of the storage unit by means of the second evaluation unit, the coupling unit may form, from the at least two electrical quantities of the storage unit, a sum of the at least two electrical quantities and thus provide a summation voltage for the second evaluation circuit, which is then assessed by the second evaluation unit with a reference value.

The memory element can be a non-volatile memory cell. In the case of a non-volatile memory element, the content is preserved even if the voltage for operation, that is to say reading from and writing to the memory element, is switched off. Examples of such memory elements are SONOS memory elements, in which the silicon nitride layer can store charge carriers and thus influences the control behavior of a modified field effect transistor. In this case, the SONOS memory elements may be set up in such a way that they can be operated in two directions. Such memory elements are also referred to as NROM memory elements. Alongside the configuration in planar form there are further configurations of SONOS memory elements that can be operated in two directions, such as, by way of example U-shaped memory elements and fin-type memory elements.

In the case of floating gate memory elements, as a further example of such non-volatile memory elements the charges are stored in a conductive layer (e.g., polysilicon) arranged in insulated fashion, in order to influence the control behavior of a modified field effect transistor. If the conductive layer arranged in insulated fashion for storing the charge carriers is divided into two conductive regions that are electrically insulated from one another, so that a first region is arranged above the channel region in the vicinity of the source and the second region is arranged in the vicinity of the drain, it is possible according to the NROM cell, to store and read out charge carriers either in the first region or in the second region by means of two different operating modes of such a modified floating gate cell (split gate).

A conductive bridging RAM (CBRAM) in which the information is stored by the presence of a conductive bridge comprising silver clusters may also be used as a non-volatile memory cell.

In the case of a ferroelectric RAM (FeRAM), the information is stored in a non-volatile manner by using the remanent polarization of a ferroelectric layer, which influences the magnitude of a capacitance.

Furthermore, as an example of non-volatile memories, mention may be made of the magnetoresistive RAM (MRAM), in which the varying orientation of the magnetization vector leads to an alteration of the resistance in order to store the information.

In accordance with a further example of non-volatile memories, in the case of an organic RAM (ORAM), the change in the resistance of a suitable material by the application of positive or negative voltages is used for the non-volatile storage of information.

In the case of a phase change RAM (PCRAM), the non-volatile storage is realized by thermally induced change in resistance during the reversible phase transition.

In various configurations of the invention it is assumed that the non-volatile memory elements described above are set up or driven in such a way that they can be operated in two different operating modes for storing more than one bit per cell in order to be able to be operated advantageously with the electronic circuit arrangement described below.

By virtue of the symmetrical construction of a SONOS memory cell corresponding to an NROM memory cell, such a SONOS cell can be operated in two different directions and two different operating modes are thus available, permitting storage of at least two bits per memory cell.

In accordance with one configuration of the invention, the at least one memory element is set up in such a way that the electrical quantities that can be provided during operation of memory elements may represent different charge states.

In accordance with one configuration of the invention, the electronic circuit arrangement has a switching unit with at least one selection element, which can feed the electrical quantity, according to the switching state of the selection element, to the at least one partial storage unit, and at least one control unit, which can predetermine the switching state of the selection element.

If the items of information have been read out from such a non-volatile memory cell in the form of electrical quantities sequentially in two different operating modes, they may be stored for the further processing of the information in a memory element of a partial storage unit which is configured, e.g., in the form of at least one capacitor. Further possibilities for storing the electrical quantities that are read out may be implemented both with volatile memory elements such as, e.g., DRAMs and with circuit arrangements such as flip-flops, registers and latches, by way of example.

In the case of the multibit memory scheme described, the intention is to determine or detect the sum of and the difference between the two memory cell currents from each side of the multibit cell. The information is stored in each case after detection during the operation of the memory element in the first direction and second direction. The current information is intended to be stored for further processing. This corresponds to a sample-and-hold mechanism. In the implementation of the circuit arrangement, the information can be held by the use of a capacitance as memory element. The voltage at the two different capacitances can then be used for the further processing.

In the electronic circuit arrangement, the at least one selection element may have at least one transmission gate.

In accordance with one configuration of the invention, the electronic circuit arrangement is set up with a control unit such that the at least one selection element can first couple a first one of the at least two electrical quantities of the memory element to the first one of the at least two partial storage units and can then couple a second one of the at least two electrical quantities to a second one of the at least two partial storage units.

The electrical quantities read out from the non-volatile memory element can be conducted into different circuit paths by virtue of the switching state of at least one selection element feeding an electrical quantity via the selected circuit path to a partial storage unit. In this case, the switching state of the selection element is controlled by a control unit that controls the selection element synchronously with the operating phase of the memory element. A suitable arrangement of transmission gates or else a corresponding multiplexer circuit, by way of example, may be used as the selection element.

The electronic circuit arrangement may be connected up in such a way that the at least one electrical quantity can be stored in the at least one partial storage unit by means of at least one capacitor.

In accordance with another configuration of the invention, the control unit is set up such that the at least one selection element can first couple a first one of the at least two electrical quantities of the memory element to the first one of the at least two partial storage units and can then couple a second one of the at least two electrical quantities to a second one of the at least two partial storage units. In the case of this coupling, the electrical state of the memory element alters the electrical state of the partial storage unit since the selection element produces a connection of the memory element in each case to at least one of the circuit paths with at least one partial storage unit.

The electronic circuit arrangement may be set up with a control unit such that first a first electrical quantity can be provided by means of operating a memory element in a first manner and then the second electrical quantity can be provided by means of operating a memory element in a second manner.

A method for reading and storing at least two electrical quantities of at least one memory element is furthermore provided, in which case in a first one of at least two operating modes of the at least one memory element, the first one of the at least two electrical quantities is fed via a selection element to a first one of at least two partial circuit paths and is stored by means of a first one of at least two partial storage units.

In a second operating mode of the at least one memory element, the second one of the at least two electrical quantities is fed via a selection element to a second partial circuit path and is stored by means of a second one of at least two partial storage units. At least one non-volatile memory element may be used for this memory element. Specifically, at least one SONOS memory element may be used as the memory element. The change in the state of the partial storage unit can be achieved by means of charging a capacitor. As an alternative, the change in the state of the partial storage unit may be achieved by means of discharging a capacitor.

The operation of the SONOS memory element may be embodied such that, in a first operating mode, the current flows from a first terminal of the memory element to the second terminal of the memory element and, in a second operating mode, the current flows from a second terminal of the memory element to the first terminal of the memory element.

The SONOS memory element may be operated such that, in a first operating mode, a voltage is applied with a magnitude such that primarily the first charge accumulation as seen in the current direction over the channel region of the memory element has the main influence on the defined electrical quantity and, in a second operating mode, a second voltage is applied with a magnitude such that both charge accumulations over the channel region of the memory element exert a significant influence on the definition of the electrical quantity.

In each operating mode of the memory element, precisely one circuit may be assigned to one path.

FIG. 1 shows a basic construction of an NROM memory cell 100 in accordance with one exemplary embodiment of the invention. A first source/drain region 110 and a second source/drain region 120 are arranged at a distance from one another on a substrate 101, the channel region 150 extending between the source/drain regions in the substrate 101. Above the channel region 150, a gate structure 130 is formed on the substrate 101, for example, made of silicon. The source/drain regions 110 and 120 and the gate structure 130 are typically connected to further circuit elements by means of electrical contacts.

The gate structure 130 has three layers, a first silicon oxide layer 141, a silicon nitride layer 142 and a second silicon oxide layer 143 in the layer sequence in accordance with this exemplary embodiment. The electrical word line contact for the application of the gate voltage to the gate structure 130 is typically achieved by means of a planar gate contact 144.

The source/drain regions 110 and 120 are typically electrically connected to the bit lines of the memory array. The gate contact 144 is electrically insulated from the channel region 150 in the substrate 101 by means of the gate structure 130. Charges can be stored within the storage layer 142 of the gate structure 130. Typically, the first charge storage region 131 is situated in the vicinity of the first source/drain region 110 within the storage layer 142 and the second charge storage region 132 is situated in the vicinity of the second source/drain region 120 within the storage layer 142.

In this case, the respective location of the charge storage regions 130 and 132 in the vicinity of the first source/drain region 110 and in the vicinity of the second source/drain region 120, respectively, is determined according to the operating conditions of the memory cell 100. The location of the charge storage regions 131 and 132 is primarily determined by virtue of the fact that the electrons in the horizontal field in the channel region 150 must have taken up, by means of a voltage between the two source/drain regions 110 and 120, respectively, so much energy that they can surmount the potential barrier of the insulating layer at this site by means of scattering with other electrons and can penetrate into the storage layer 142.

The storage layer 142 of a charge-trapping memory cell 100 is situated between boundary layers 141 and 143 made of a material having a higher energy band gap than the energy band gap of the storage layer, so that the charge carriers trapped in the storage layer 142 remain localized there.

The difference in the energy band gaps is significant, and this can be achieved by means of varying the materials of the storage layer 142 and also by means of varying the boundary layers 141 and 143, in which case the difference between the energy band gaps is intended to be as large as possible for good electrical confinement of the charge carriers.

Suitable materials for the storage layer of the memory cell 100 are typically nitrides, and an oxide is typically used as a boundary layer. The NROM memory cell already described is an example of an oxide-nitride-oxide (ONO) storage layer sequence in the material system of silicon.

In this case, the silicon nitride storage layer typically has an energy band gap of approximately 5 eV and the surrounding boundary layers are silicon oxide having an energy band gap of approximately 9 eV.

In conjunction with silicon oxide as a boundary layer, it is possible, e.g., as an alternative to use tantalum oxide, hafnium silicate, titanium oxide ($TiO_2$ in the case of stoichiometric composition), zirconium oxide ($ZrO_2$ in the case of stoichiometric composition), aluminium oxide ($Al_2O_3$ in the case of stoichiometric composition) or intrinsically conducting (undoped) silicon as material of the storage layer.

The first bit of such a two-bit NROM memory cell 100 is programmed in such a way that a vertical electric field is generated by means of a gate voltage. In the first operating direction, by means of the application of a voltage between the first source/drain region 110 and the second source/drain region 120, in the channel region 150 of the memory cell 100, a lateral electric field is additionally generated in a first operating direction, which electric field accelerates the electrons along the channel length. In this case, some electrons are accelerated by means of scattering such that, in the channel region 150 in the vicinity of the second source/drain region 120, where the lateral electric field is strongest, they jump over the potential barrier and reach the charge storage layer 142 and define the second charge storage region 132.

By means of such a charge accumulation in the charge storage layer 142, the threshold voltage of the memory cell 100 changes, which can typically be ascertained by means of applying a read voltage in an opposite direction to the first operating direction.

The second bit in this memory cell 100 is typically programmed by applying an opposite voltage to the first operating direction between the second source/drain region 120 and the first source/drain region 110. In this case, the electrons in the vicinity of the first source/drain region 110 will pass over the potential barrier into the first charge storage region 131 of the charge storage layer 142. By means of the presence or absence of negative charges in the charge storage regions 131 and 132, it is possible in a non-volatile memory cell 100, such as an NROM cell for example, to store an information item of two bits in geometrically separated charge storage regions.

When reading out the states, in this operating mode, the charge state is detected in each case by means of a read voltage applied in the opposite direction to the programming operation (reverse read) between the respective source/drain regions 110 and 120.

The predominantly symmetrical construction of this memory cell 100 enables operation in a first operating direction from the first source/drain region 110 to the second source/drain region 120, and also correspondingly reversed operation from the second source/drain region 120 to the first source/drain region 110.

These operating directions are used both for programming and for reading. If operation in the first direction is effected during programming, for example, this charge state, which is presently stored in the second charge storage region 132, is read out by the memory cell 100 being operated in the opposite direction, so that the second charge storage region 132 is principally crucial for the resulting electrical quantity. The first charge state in the vicinity of the first source/drain region 110 in the charge storage region 131 is programmed and read in the case of a correspondingly respectively reversed operating mode.

These two operating modes make it possible to store at least four different electrical states and thus at least two bits since charge carriers can be stored in the two charge storage regions 131 and 132 or can be compensated for by means of the correspondingly oppositely charged charge carriers.

The stored information is detected, e.g., by determining the threshold voltage of the memory cell transistor $V_T$ as a possible electrical quantity, which defines the charge state of the memory element.

Crosstalk, in the case of which charges, e.g., in the second charge storage region 132, influence the electrical quantity during the read-out of the first charge storage region 131, may have an effect as follows.

For the purpose of reading the NROM memory cell 100, a specific control gate voltage is applied between the control gate 144 and the first source/drain region 110. In addition, a positive voltage is applied between the first source/drain region 110 and the second source/drain region 120. In the case of this voltage direction, the amount of charge in the storage layer in the vicinity of the first source/drain region 110 is then detected since, in the case of this operating direction, the inversion layer charge in the channel region 150 in the vicinity of the first source/drain region 110 is greater than the inversion layer charge in the channel region in the vicinity of the second source/drain region 120.

If, by way of example, a negative charge is stored in the nitride layer in the first charge storage region 131 in the vicinity of the first source/drain region 110, then it impedes, for a positively doped channel zone 150, the formation of a conductive channel between the first source/drain region 110 and the second source/drain region 120 and a significantly lower current flows at this gate voltage than if there were no negative charge stored in the nitride layer 142 in the first charge storage region 131.

By way of example, if there is no negative electrical charge present in the first charge storage region 131 in the vicinity of the first source/drain region 110, but negative electrical charges are present in the second charge storage region 132 in the vicinity of the second source/drain region 120 of the NROM cell 100, this may also have the effect that the threshold voltage of the transfer characteristic curve is altered during operation in the first operating direction of the NROM cell 100 such that, by way of example, no drain current flows at the specific gate voltage.

In order to reduce the effect of crosstalk, which is all the more pronounced, the greater the difference between the amounts of charge in the storage layer 142 in the two charge storage regions 131 and 132, the differential memory concept as described in U.S. Patent Application Publication No. 2005/0195650 was introduced, which publication is hereby incorporated by reference in its entirety in the description.

Different charge states of the memory cell 100 are achieved during the programming of the memory cell 100. In the case of the NROM memory cell 100 described, defined charge states can be programmed for both of the two charge storage regions 131, 132 and be read out again. The charge states can be set in equivalent fashion by means of suitable combination of different logic states and thus serve for storing binary information items.

In this case, the amount of charges stored in the charge storage regions 131 and 132 can be chosen in a suitable manner and is to be chosen freely on an analog scale. A plurality of ranges of a certain amount of charges is typically defined for the assignment to a charge state of the charge storage regions 131 and 132 in order thereby to perform a certain digitization of the programming and thus achieve a greater resistance to errors for the programming and reading under, e.g., altered operating conditions of the memory cells or production tolerances of the memory cells.

Accuracies during programming and reading and also during the production of the memory cells and the aging of the memory cells determine the width of the charge storage regions 131, 132.

FIG. 2a illustrates the different logic states for storing two bits in accordance with the differential memory concept, which is also referred to as the multibit memory scheme. The filled-in circles 251 to 258 each symbolize the value of the threshold voltage, resulting from the charge states of the first charge storage region 131 and of the second charge storage region 132, of a memory cell. In this case, the odd reference symbols 251, 253, 255 and 257 in each case denote the charge states of the first charge storage region 131 and the even reference symbols 252, 254, 256 and 258 denote the charge states of the second charge storage region 132.

The four charge states are distributed between two charge amount ranges 210 and 220. In this case the distance between the two charge amount ranges 210 and 220 is typically greater than the distance between the charge states within a charge amount range.

The distance between the two charge amount ranges 210 and 220 is chosen such that under practical conditions it is possible when reading the memory cell to reliably distinguish whether a charge state corresponding to a lower, first charge amount range 210 or a charge state corresponding to an upper, second charge amount range 220 has been programmed.

In the case of the first logic state illustrated in FIG. 2a, the charge state 251 of the first charge storage region 131 lies below the charge state 252 of the second charge storage region 132, in which case the logic state results when reading both by means of the sign of the threshold voltage difference upon comparison of read operation in the second direction in comparison with read operation in the first operating direction, and by means of the position of the threshold voltages in both read directions according to the lower, first charge amount range 210.

The second logic state illustrated in FIG. 2b then results in an analogous form with the opposite sign of the threshold voltage difference now resulting upon comparison of read operation in the second direction in comparison with read operation in the first operating direction. In this case, the difference between the charge states according to FIG. 2a and the charge states according to FIG. 2b are typically comparable in terms of magnitude, and only the mathematical sign of the difference between the two threshold voltages is crucial for the evaluation of the stored logic state. Since only the sign of the difference has to be detected in order to distinguish the logic states according to FIG. 2a and FIG. 2b, for reliable operation it is possible to choose the difference between the charge states within the charge amount range 210.

The third logic state illustrated in FIG. 2c and the fourth logic state illustrated in FIG. 2d result in a comparable manner to the first and second logic states, here the corresponding threshold voltages resulting in each case at the higher level according to the upper, second charge amount range 220. Here, too the sign of the respective difference between the corresponding threshold voltages is crucial for the difference between the third logic state and the fourth logic state.

One advantage of the differential memory concept in accordance with FIG. 2a to FIG. 2d can be seen in the fact that in each case the difference between the first charge storage region 131 and the second charge storage region 132 of the memory cell is programmed and read, both threshold voltages lying within a small threshold voltage range. According to the small charge state differences in the two charge storage regions 131 and 132, relatively large threshold voltage differences between the two sides of a cell never occur, whereby crosstalk is reduced.

As an example of the differential memory concept, it is possible to specify the difference in the threshold voltages between the lower threshold voltage range, which corresponds to the lower, first charge amount range 210 and the higher threshold voltage range which corresponds to the upper, second charge amount range 220, as approximately 1.5 V and the threshold voltage difference within the charge amount range 210 or 220, that is to say between, e.g., the first charge state 251 and the second charge state 252 or respectively between, e.g., the third charge state 255 and the fourth charge state 256, as approximately 300 mV. However, other differences can also be realized.

Four charge states distributed between two charge amount ranges 210 and 220 have been described in the example above. Consequently, the memory cell is a two-bit memory cell. If one or more additional charge amount ranges are defined in addition to the first charge amount range 210 and second charge amount range 220, then additional bits can be programmed in a memory cell and read out in an analogous manner.

From the basic understanding of the operating concept according to the NROM memory cell 100, it is possible to define even further operating modes of a memory cell in order to read out programmed states.

If permitted by the accuracy of the measurement of the threshold voltage, it is possible to determine the read-out of the threshold voltage levels in the two operating directions even in the case of operation only in one direction.

In this case, different voltages are applied between the first source/drain region and the second source/drain region in such a way that, by means of a significantly lower voltage of, e.g., 0.4 V, the crosstalk described is utilized to determine the average level of the threshold voltage and thus the charge amount range 210 or 220 and possibly further charge amount ranges.

By maintaining the same operating direction but applying a higher voltage, in order to reduce the crosstalk, the magnitude of the charge state of a relevant charge amount range such as, e.g., 210, 220 or of further charge amount ranges of the present operating direction is detected and can be used in the comparison with respect to the average level of the charge amount range in order to determine the sign of the level difference.

Both the level of the threshold voltage and the sign of the threshold voltage difference have thus been determined. The threshold voltage serves here as an example of an electrical quantity that may result from the charge states of the memory cell depending on the operating concept. Other electrical quantities, such as, e.g., specific currents under defined operating conditions, may also be derived from the charge states.

An electronic circuit arrangement and a method for determining and providing electrical quantities of a memory element are explained below, in which case, with the aid of a control unit, the memory element is driven and operated in at least two different operating modes and the electrical quantities that are read out sequentially in this case are fed in synchronized fashion to at least two different partial circuit paths. The partial storage units connected to the circuit paths store the resulting electrical quantities and provide them for further processing.

Figure 3:
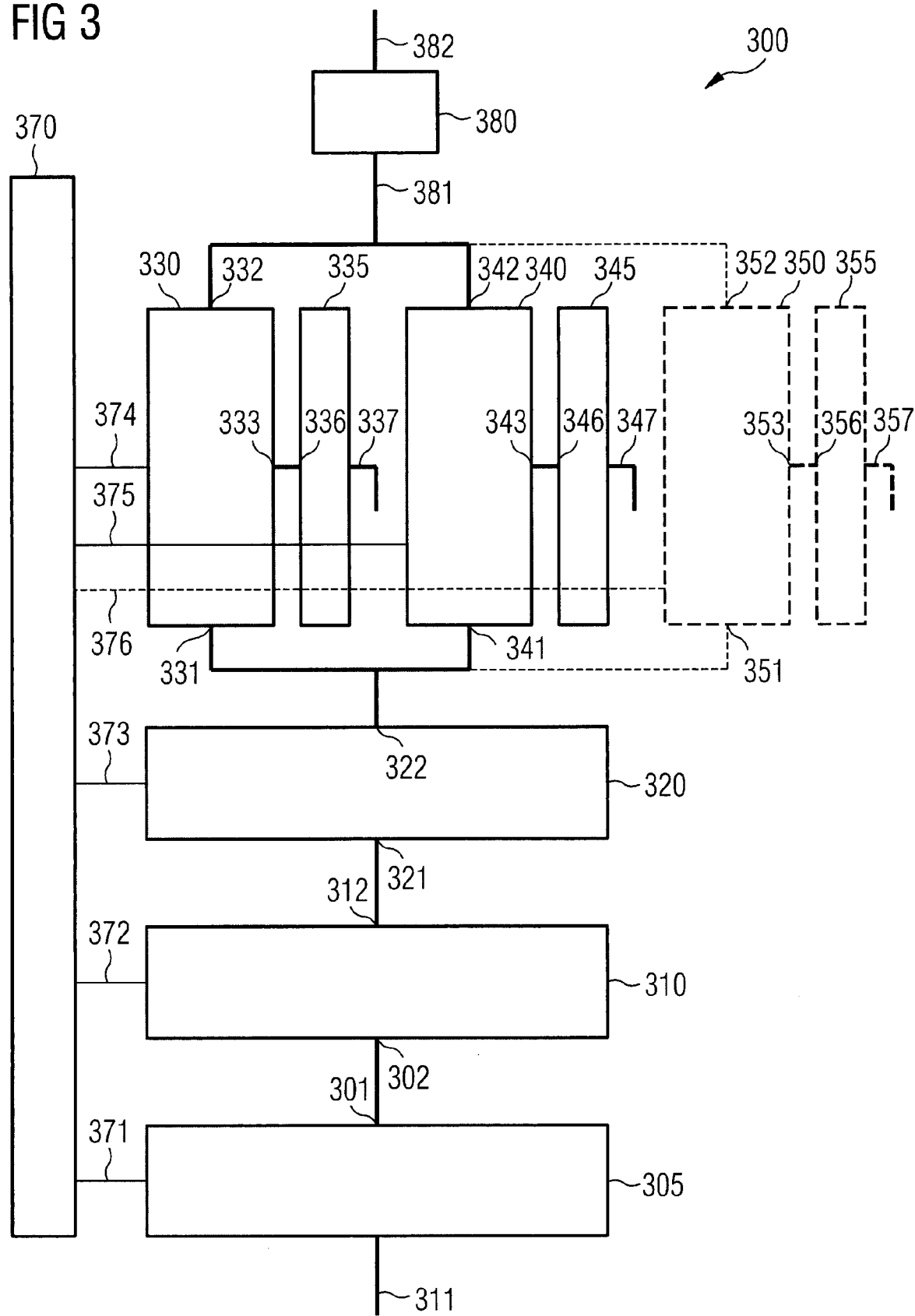
FIG. 3 shows a block diagram of the circuit arrangement.

FIG. 3 shows a block diagram of an electronic circuit arrangement 300 for determining and providing electrical quantities of the memory cells described above. The basic circuit of the circuit arrangement 300 has a series circuit comprising a first decoder 305, a memory array 310, a second decoder 320, a plurality of partial circuit paths 330 and 340 connected in parallel, a current/voltage converter 380 and a control unit 370 connected in parallel, which is connected via its control lines 371 to, if appropriate, 376 to the first decoder 305, to the memory array 310, to the second decoder 320 and also to the partial circuit paths 330 and 340. The partial circuit paths 330 and 340 are respectively connected to the partial storage units 335 and 345.

An optional extension of the circuit with additional partial circuit paths is possible by means of an optional additional partial circuit path 350 correspondingly connected in parallel with the other partial circuit paths 330 and 340, with the connection to its additional partial storage unit 355 and the connection 376 to the control unit 370.

The first decoder 305 has a first connection 311 and a second connection 301. The first connection 311 of the series circuit at the first decoder 305 is typically connected to a lower electrical potential $V_1$ than a second connection 382 of the series circuit at the current/voltage converter 380, which is connected to a potential $V_2$.

The memory array 310 has a first connection 302 and a second connection 312. The second connection 301 of the first decoder 305 is connected to the first connection 302 at the memory array 310.

The second connection 312 of the memory array 310 is connected to a first connection 321 of the second decoder circuit 320, the second connection 322 of which is connected to a first connection 331 of a first partial circuit path 330 and to a first connection 341 of a second partial circuit path 340; the second connection 322 of the second decoder circuit 320 may furthermore be connected to a first connection 351 of optionally additional partial circuit paths 350.

Each partial circuit path 330, 340 and if appropriate, each of the additional partial circuit paths 350 is connected by its respective third connection 333 and 343 and, if appropriate 353 to a first connection 336, 346 and, if appropriate, 356 to a respective partial storage unit 335, 345 and, if appropriate 355 to the connections 336, 346 and 356 of the partial storage unit 335, 345, and, if appropriate, 355.

A second connection 337, 347 and optionally 357 of the partial storage units 335, 345 and, if appropriate, 355 may in each case be connected to a lower or higher (for example in the case of source-side sensing) potential than the second connection 382 of the series circuit at the current/voltage converter 380. The second connections 332, 342 and, if appropriate, 352 of the partial circuit paths 330, 340 and optionally 350 are connected to one another and connected to a first connection 381 of the current/voltage converter 380.

A second connection 382 of the current/voltage converter 380, which corresponds to the second connection of the series circuit, may be connected to a higher electrical connection $V_2$.

Leading from the control unit 370 are, by way of example, respectively at least one control line 371 to the first decoder 305, at least one control line 372 to the memory array 310, at least one control line 373 to the second decoder 320, at least one control line 374 to the first partial circuit path 330, at least one control line 375 to the second partial circuit path 340 and, if appropriate, control lines such as the control line 376 to optional additional partial circuit paths such as the optional additional partial circuit path 350.

The operation of the circuit arrangement 300 is explained in more detail below with reference to FIG. 3.

If, by means of the driving by the control unit 370 both of the first address decoder circuit 305, and of the memory array 310 and of the second address decoder circuit 320, a memory element in the memory array 310 is operated in a first manner, the first partial circuit 330 is switched by means of the control unit 370 such that the resulting electrical quantity changes the state of the first partial storage unit 335. The other partial circuit paths 340 and, if appropriate, 350 are switched by means of the control unit 370 such that the associated partial storage units 345, and, if appropriate, 355 remain unchanged.

If, in a further step, by means of the driving by the control unit 370 both of the first decoder circuit 305, and of the memory array 310 and of the second decoder circuit 320, a memory element in the memory array 310 is operated in a second manner, the second partial circuit path 340 is switched by means of the control unit 370 such that the resulting electrical quantity changes the state of the second partial storage unit 345. The other partial circuit paths 330 and, if appropriate, 350 are switched by means of the control unit 370 such that the associated partial storage units 335, and, if appropriate, 355 remain unchanged.

By means of the state changes of the partial storage units 335 and 345, and, if appropriate, additional partial storage units such as 355, the electrical quantities are then ready to be processed further.

The current/voltage converter 380 can be used to suitably convert electrical quantities from the memory element from the memory array 310 for the partial storage units 335, 345 and, if appropriate, 355.

Figure 4:
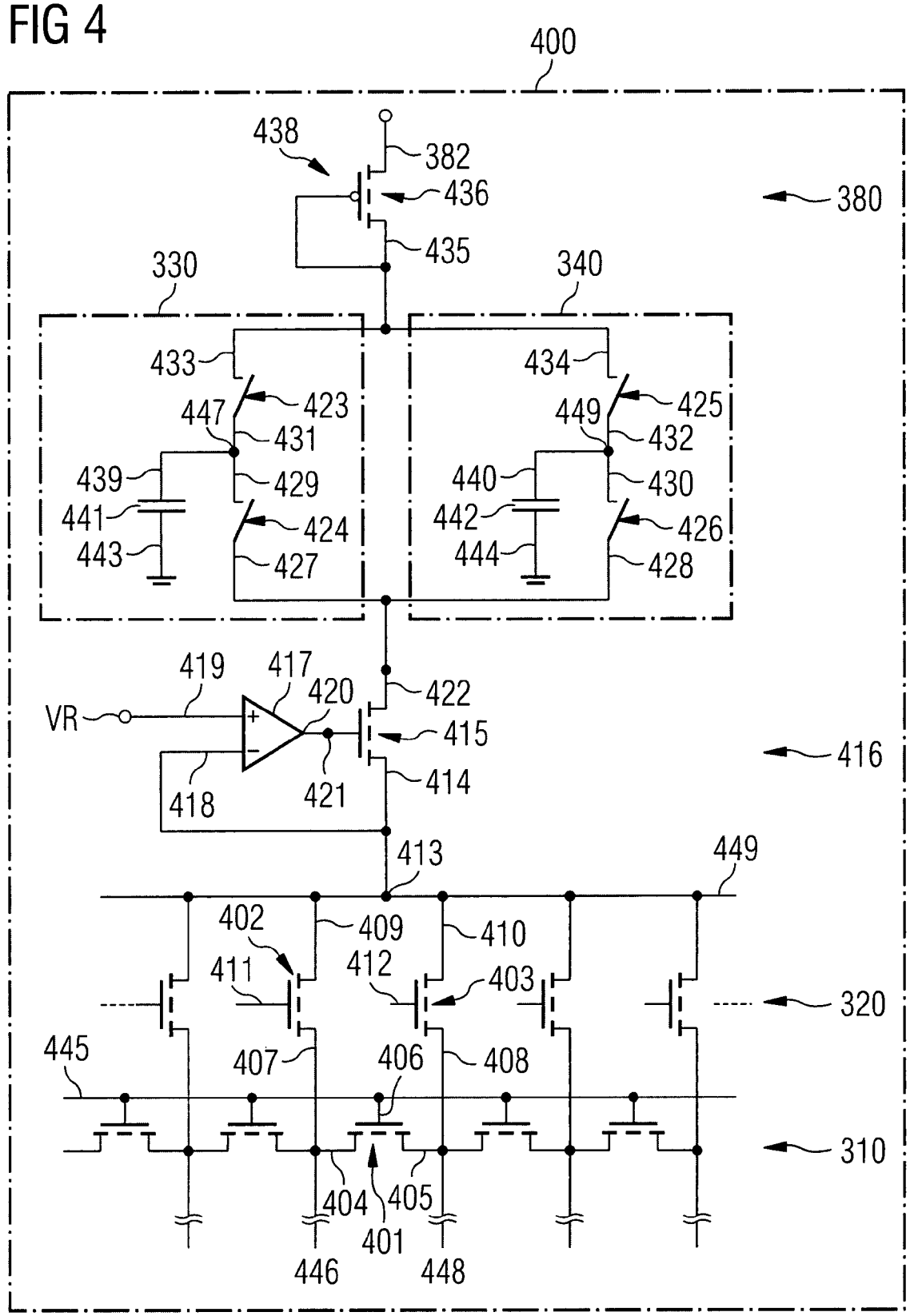
FIG. 4 shows an electronic measuring circuit arrangement with drain-side sensing in accordance with a first embodiment of the invention.

FIG. 4 shows a detail realization with individual elements of the electronic circuit arrangement 300 from FIG. 3 in accordance with a first exemplary embodiment of the invention. In this case, a more detailed description of the first address decoder circuit is dispensed with for reasons of simple description of the invention. The decoder circuits are embodied in a single stage here for reasons of simpler description. The decoders may also be configured in multiple stages.

As illustrated in FIG. 4, a first variant 400 of the drain-side sensing measuring circuit arrangement 300 has memory elements such as, e.g., 401 arranged in series one alongside another in the memory element array 310, from which memory elements, with the aid of the first decoder and selection transistors such as, e.g., 402 and 403 of the second decoder 320 and the control unit 370 connected to the memory array 310 and the second decoder 320, a memory element 401 can be selected and an electrical quantity of the memory element 401 can be fed to a partial circuit path such as, e.g., 330 or 340 monitored by the control unit 370.

According to FIG. 4, the measuring circuit arrangement 300 in accordance with a first embodiment 400 has memory elements 401 arranged in series one alongside another and each having a first connection (first source/drain region) 404, a second connection (second source/drain region) 405 and a control connection (gate) 406, which are in each case electrically connected to the second connection 405 of the first memory element 401 at the first connection of the memory element arranged alongside it.

These memory elements 401 arranged one alongside another constitute an extract from the memory array 310, in which, in the "virtual ground" architecture of the memory element array 310, a plurality of such memory elements 401 arranged one alongside another may be present in a manner connected in parallel. However, the memory element array 310 may also be present in different memory element architectures than is set forth in this first exemplary embodiment.

The control connections 406 of the memory elements 401 arranged in a series one alongside another are in each case electrically connected to one another and can be connected to the control unit 370. The first connections such as 404 and the second connections 405 of the memory elements such as, e.g., 401 can be connected according to further circuitry interconnection to the ground potential or some other first potential. In this case, this first potential $V_1$ may be lower than a second potential $V_2$ provided at the second connection 382 of the current/voltage converter 380.

The memory elements such as, e.g., 401 of the memory element array 310 can be connected via the selection transistors 402 and 403 of the second decoder 320 to the partial circuit paths such as 330 and 340, respectively. The selection transistors 402 and 403 have a first connection 407 and 408, respectively, a second connection 409 and 410, respectively, and a third connection 411 and 412, respectively. The third connection 411 and 412 of the selection transistors 402 and 403, respectively, can be connected to the control unit 370.

The first connection 404 of the memory elements 401 is in each case connected to a first connection 407 of the first selection transistor 402. The second connection 405 of the memory elements 401 is in each case connected to a first connection 408 of the second selection transistor 403.

The respective second connections 409 and 410 of the selection transistors 402 and 403 of the second decoder 320 are in each case connected to one another, e.g., by means of a connecting line 449 and to an output mode 413 of the second decoder 320 and are connected, moreover, to a first connection (source) 415 of a regulating field effect transistor 415 of a potentiostat circuit 416. The potentiostat circuit 416 serves for keeping the potential of the memory elements 401 as constant as possible during the read-out of the electrical quantity under varying operating conditions of the electronic circuit 300.

The first connection 414 of the potentiostat circuit 416, having the regulating FET 415 and an operational amplifier 417 is connected to the inverting input 418 of the operational amplifier 417. The non-inverting input 419 can be connected to a reference potential $V_1$. The output 420 of the operational amplifier 417 is connected to the control connection 421 (gate) of the regulating field effect transistor 415.

It is assumed in the description of the circuit that an N-type is used for the regulating FET. If a P-type regulating FET were used, the connections to the operational amplifier 417 would be interchanged. Instead of the operational amplifier 417, it is also possible to use a differential amplifier, which is not explained in any greater detail here for the sake of clarity.

The second connection 422 of the regulating field effect transistor 415, which is identical to the second connection 422 of the potentiostat circuit 416, is connected to the two electrical paths 330 and 340. In each of these electrical paths 330 and 340, two switches 423 and 424, and respectively 425 and 426, are connected to one another in series. That is to say, the respective first connection 427 and 428 of the first switch 424 and 426, respectively, in the respective path 330 and 340 is connected to the second connection 422 of the regulating field effect transistor 415.

The second connection 429 and 430 of the first switch 424 and 426, respectively, in the respective path 330, 340 is connected to the first connection 431 and 432 of a second switch 423 and 425, respectively. The switches 423 and 424, 425 and 426 in the two paths 330 and 340 can be switched by means of the control unit 370.

The two second connections 433 and 434 of the second switches 423 and 425, respectively, in the two paths 330, 340 are connected to one another. This connection is connected to a first connection 435 of a field effect transistor 436 connected as a diode, and a second connection 382 of this diode circuit can be connected to the voltage supply or a second potential $V_2$, which is typically higher than the first potential $V_1$.

In order to act as a diode, the first connection 435 of the field effect transistor 436 is connected to the control connection 438 of the field effect transistor 436. The current/voltage conversion achieved by a field effect transistor 436 connected in such a way that may also be achieved by means of a transistor connected as an active load. A further embodiment could be achieved by using a suitable resistor. What can be achieved with such current/voltage conversion is that a small change in the current intensity results in the largest possible change in the voltage.

The second connection 429 and 430 of the respective first switch 424 and 426 in the two paths 330 and 340, respectively, is connected to a first connection 439 and 440 of a capacitor 441 and 442, respectively, the second connection 443 and 444, respectively, of which may be connected for example to the reference-earth potential or some other first potential $V_1$.

The switching elements 423, 424, 425 and 426 can be controlled by the control unit 370 and are embodied, e.g., as a transmission gate component or, e.g., as a transfer gate component. Other embodiments of the switching element may also be used in alternative configurations of the invention.

Figure 6:
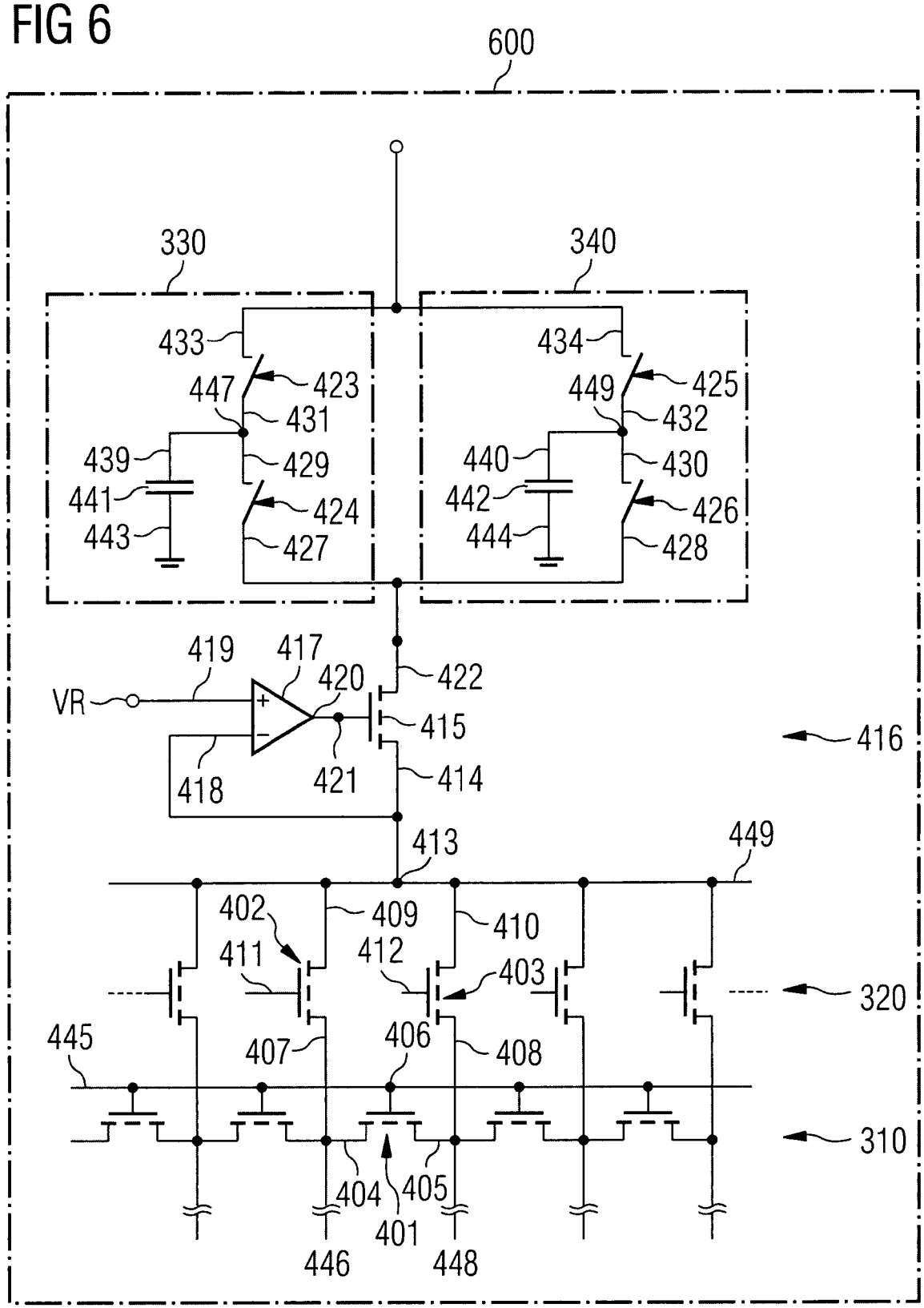
FIG. 6 shows an electronic measuring circuit arrangement with drain-side sensing according to a second exemplary embodiment of the invention.

An electronic drain-side sensing measuring circuit arrangement 600 in accordance with a second exemplary embodiment of the invention is illustrated in FIG. 6 and essentially corresponds to the electronic drain-side sensing measuring circuit arrangement 300 illustrated in FIG. 4 with the following differences:

The current/voltage converter 380 of FIG. 4, with the FET 436 connected as a diode and the connections 435, 382 and 438, has been omitted. In the drain-side sensing measuring circuit arrangement 600 in accordance with this exemplary embodiment, the second potential $V_2$ or the supply voltage $V_{CC}$ may be directly connected to the interconnected second connections 433 and 434 of the second switches 423 and 425. The modified driving of this modified measuring circuit arrangement 600 by comparison with the embodiment illustrated in FIG. 4 is explained below after the description of the driving of the drain-side sensing measuring circuit arrangement in accordance with the first exemplary embodiment of the electronic circuit arrangement 300.

Figure 8:
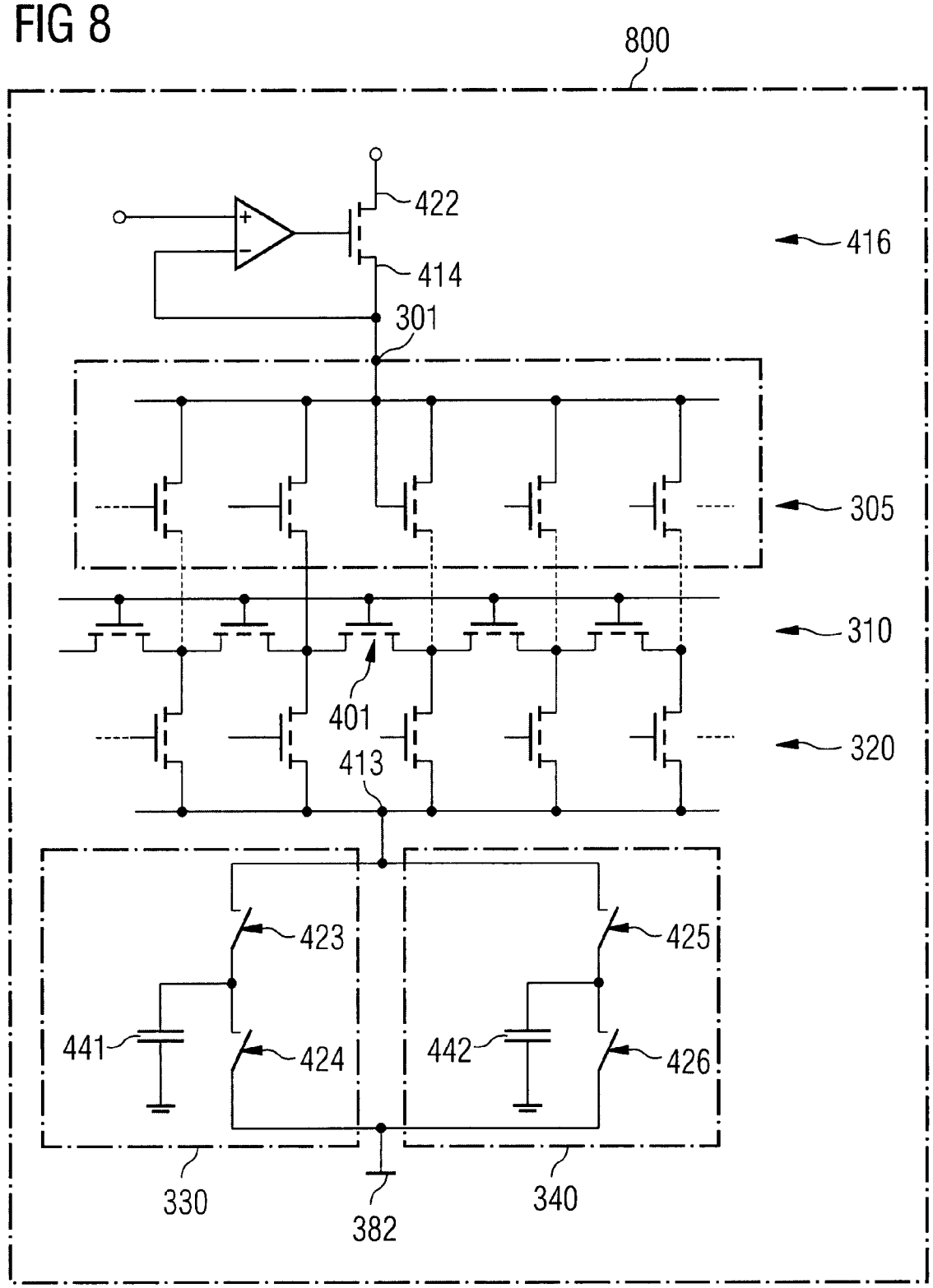
FIG. 8 shows an electronic measuring circuit arrangement with source-side sensing according to a third exemplary embodiment of the invention.

A source-side sensing measuring circuit arrangement 800 in FIG. 8 in accordance with a third exemplary embodiment corresponds to the drain-side sensing measuring circuit arrangement 600 in accordance with the exemplary embodiment illustrated in FIG. 6 with the following differences:

The output node 413 of the second decoder 320 is directly connected to the two partial circuit paths 330 and 340. In this exemplary embodiment, the second connection 382 of the series circuit is at low potential, typically ground potential. The potentiostat circuit 416 is connected by the first connection 414 to the second connection 301 of the first decoder 305, whereby it is possible to set the operating conditions of the memory elements 401 for reliable detection of the charge state of the memory element 401. The second connection 422 of the potentiostat circuit 416 is connected to the higher potential $V_2$.

By means of corresponding driving—described later—of this source-side sensing measuring circuit arrangement 800 by means of the control unit 370, it is possible, in this exemplary embodiment of the circuit, too, for the charge state, e.g., of the memory element 401 to be read out, stored and provided for further electrical processing.

An explanation is given below, by way of example, of the driving of the electronic drain-side sensing measuring circuit arrangement 300 according to the first exemplary embodiment illustrated in FIG. 4, with the memory elements 401 being operated in at least two operating modes for reading out and providing the electrical quantities in a manner referred to as voltage integration IV (integration voltage).

In a first operating mode 501 (cf. diagram 500 in FIG. 5) of the driving, the memory element 401 is switched by means of the application of a suitable voltage by means of the control unit 370 to a memory element selection connection 445 via the control gate 406 and a suitable voltage to the first source/drain connection 404 for the first operating mode of the memory element 401 such that, depending on the storage state of the memory element 401, a corresponding current can flow from a first connection 446, at which a first potential $V_1$ is present, through the first source/drain connection 404 to the second source/drain connection 405.

By means of a suitable driving of the control gate 412 of the selection transistor 403 of the second decoder circuit 320 by means of the control unit 370, the memory element 401 to be detected is connected via the selection transistor 403 to the output node 413 of the second decoder circuit 320.

The output node 413 of the second decoder circuit 320 is driven by means of the potentiostat circuit 416 such that, by control of the current through regulating FET 415, it holds the node 413 at a constant potential $V_R$ corresponding to the reference voltage $V_R$. The operating conditions of the memory elements 401 for reliable detection of the charge state of the memory element 401 are thereby set.

Figure 5:
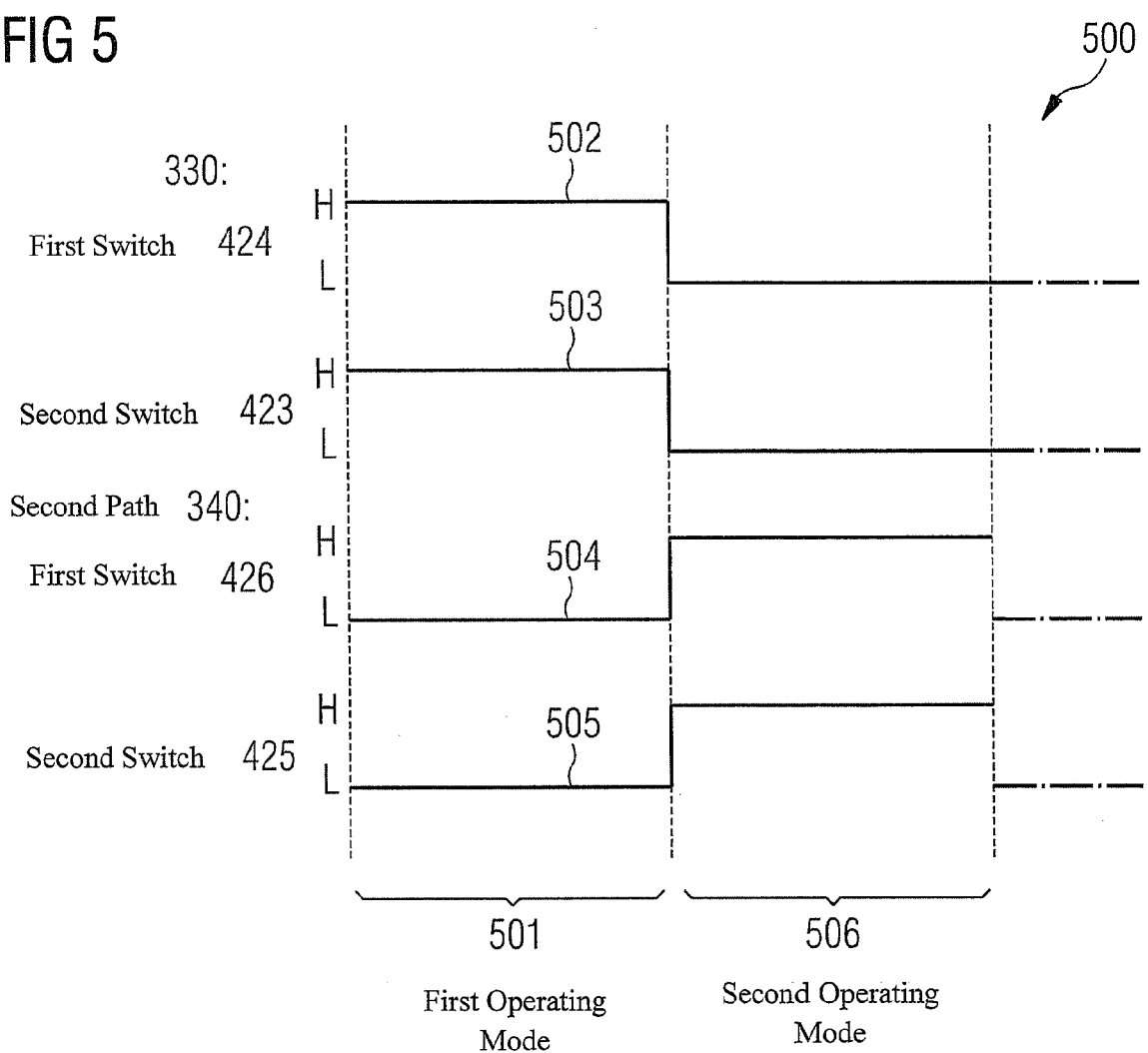
FIG. 5 shows a drive sequence of an electronic measuring circuit arrangement with drain-side sensing according to a first embodiment of the invention.

The switches 423 and 424 in the first path 330 are both switched to be conducting "H" (see switching profile 502 of the first switch 424 of the first path 330 and switching profile 503 of the second switch 423 of the first path 330 in FIG. 5) and the switches 426 and 425 in the second path 340 are both switched to be non-conducting "L" (see switching profile 504 of the first switch 426 of the second path 340 and switching profile 505 of the second switch 425 of the second path 340 in FIG. 5). As a result, a voltage $V_{F1}$ is established at the node 447 according to the current in the first path 330 by means of the current-voltage converter 380, which is embodied here as FET 436 connected as a diode, which voltage is stored by the partial storage unit 441, which is embodied as a capacitor 441 here, within the first phase 501. The RC element is advantageously dimensioned such that the product of resistance and capacitance is less than the time duration of the phase 501 in order that the instantaneous voltage data is stored.

After the first operating mode of the memory element 401 the switches 423 and 424 are switched to be non-conducting "L" in a second operating mode 506 in order to obtain the electrical state of the partial storage unit 441.

In the second operating mode 506 of the driving, the memory element 401, after the application of a suitable voltage by means of the control unit 370 to the memory element selection connection 445 via the control gate 406 and a suitable voltage to a second connection 448 and thus to the second source/drain connection 405 for the second operating mode of the memory element 401, is switched such that, depending on the storage state of the memory element 401, a corresponding current can flow from the second connection 448, at which a first potential $V_1$ is present, through the second source/drain connection 405 to the first source/drain connection 404. By means of a suitable driving of the control gate 411 of the selection transistor 402 of the second decoder circuit 320 by means of the control unit 370, the memory element 401 to be detected is connected via the selection transistor 402 to the output node 413 of the second decoder circuit 320.

Once again, the output node 413 of the second decoder circuit 320 is driven by means of the potentiostat circuit 416 such that, by control of the current through regulating FET 415, it holds the node 413 at a constant potential $V_R$ corresponding to the reference voltage $V_R$. The operating conditions of the memory elements 401 for reliable detection of the charge state of the memory element 401 are thereby set.

The switching elements 423 and 424 in the first path 330 are both switched to be non-conducting "L" and the switches 425 and 426 in the second path 340 are both switched to be conducting "H". As a result, the voltage $V_{F2}$ is established at the node 449 according to the current in the second path 340 by means of the current-voltage converter 380, which is embodied here as a FET 436 connected to the diode, which voltage is stored by the partial storage unit 442, which is embodied here as a capacitor 442.

After this second operating mode 506 of the memory element 401, the switches 425 and 426 are both switched to be non-conducting "L" by the control unit 370 in order to obtain the electrical state of the partial storage unit 442. The two partial storage units 441 and 442 have now assumed electrical states that correlate with the charge state of the memory element 401 and provide the electrical states for further data processing.

Figure 12:
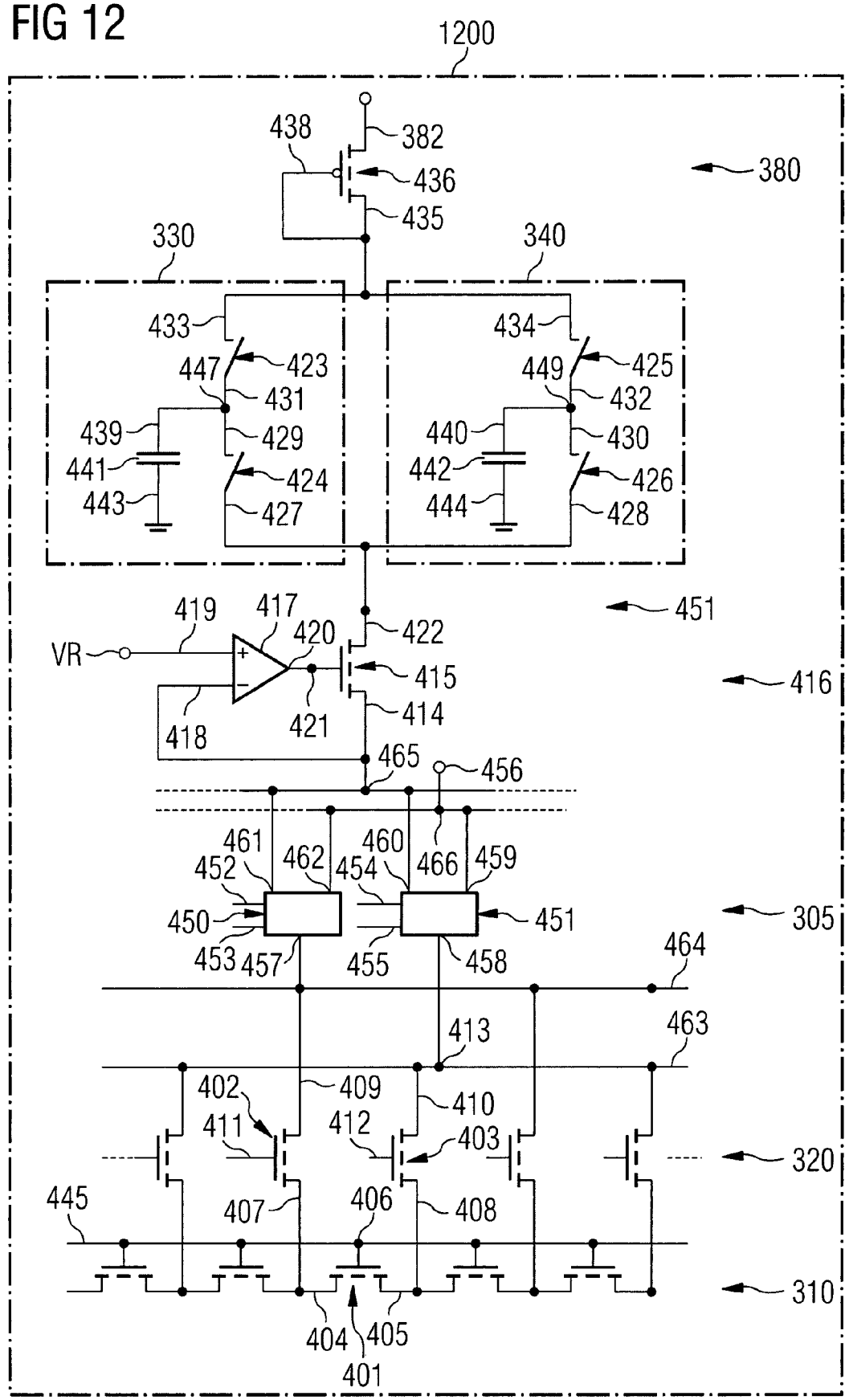
FIG. 12 shows an electrical circuit arrangement with drain-side sensing in accordance with a fourth exemplary embodiment of the invention.

FIG. 12 shows a measuring circuit arrangement 1200 as a modification of the measuring circuit arrangement 600.

In the case of the measuring circuit arrangement 1200, in modification of the measuring circuit arrangement 300 of FIG. 3, the second connection 301 of the first decoder 305 of the measuring circuit arrangement 1200 is connected to the second connection 322 of the second decoder 320 of the measuring circuit arrangement 1200 such that the circuit can be constructed with fewer selection transistors by comparison with the measuring circuit arrangement 300.

Figure 13A:
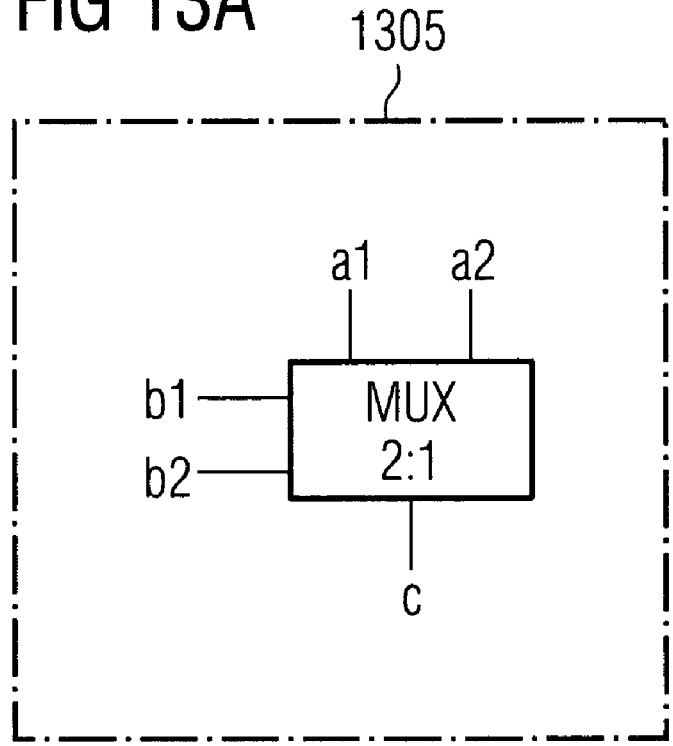
FIG. 13 shows an exemplary embodiment of a circuit block of an electrical circuit arrangement with drain-side sensing.
Figure 13B:
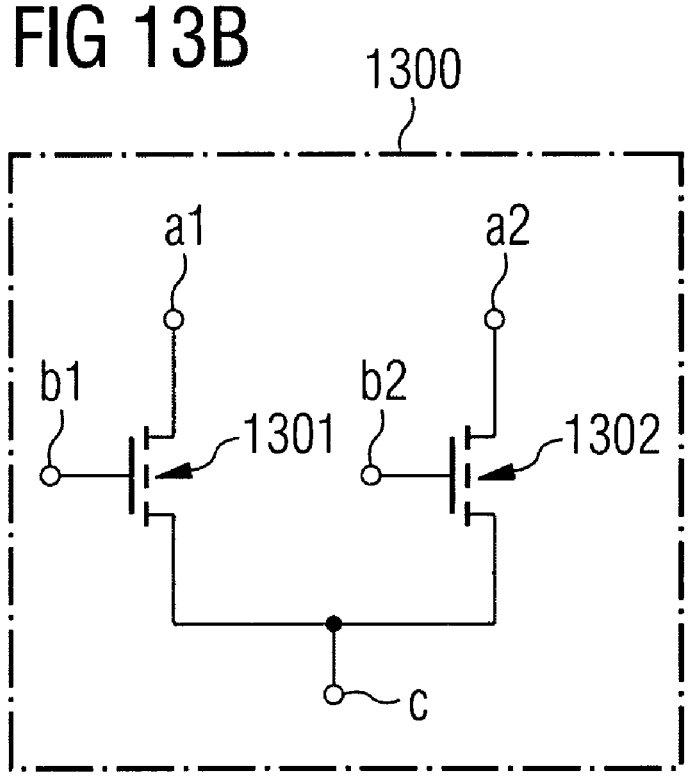

The first decoder 305 of the measuring circuit arrangement 1200 has at least two multiplexer circuits 450 and 451. One embodiment of the multiplexer circuits 450 and 451 with two FET transistors 1301 and 1302 is shown in FIG. 13b. The block diagram 1305 of the multiplexer circuit 1300 of FIG. 13a has an input c, a first output a1 and a second output a2 and a first control connection b1 and a second control connection b2.

The embodiment of the multiplexer circuit 1300 according to FIG. 13b has a first FET 1301 and a second FET 1302. The first connection of the first FET 1301 and the first connection of the second FET 1302 are connected to the input c of the multiplexer circuit. The second connection of the first FET 1301 is connected to the first output a1 of the multiplexer circuit. The second connection of the second FET 1302 is connected to the second output a2. The third connection of the first FET 1301 is connected to the first control connection b1 of the multiplexer circuit and the third connection of the second FET 1302 is connected to the second control connection b2 of the multiplexer circuit.

In the exemplary embodiment of the measuring circuit arrangement 1200 the second decoder circuit 320 has a first selection transistor such as, e.g., 402 and a second selection transistor such as, e.g., 403 for each memory element such as, e.g., 401.

In the measuring circuit arrangement 1200, the second connection such as, e.g., 409 of the respective first selection transistor such as, e.g., 402 of the second decoder circuit 320 is in each case respectively connected to one another, e.g., by means of a connection line 464. The respective second connections such as, e.g., 410 of the second selection transistors such as e.g. 403 are in each case connected to one another, e.g., by means of a connection line 463.

The input 457 of the first multiplexer circuit such as, e.g., 450 is connected, e.g., by means of the connection line 464 in each case to the second connections such as, e.g., 409 of the first selection transistors such as, e.g., 402. The input 458 of the second multiplexer circuit such as, e.g., 451 is connected, e.g., by means of the connection line 463 in each case to the second connections such as, e.g., 410 of the second selection transistors such as, e.g., 403.

The first outputs of the multiplexer circuits such as, e.g., 461 of the first multiplexer circuit 450 are in each case connected to the first outputs such as, e.g., 460 of the multiplexer circuits such as, e.g., of the second multiplexer circuit 451 and to the node 465. The second outputs of the multiplexer circuits such as, e.g., 462 of the first multiplexer circuit 450 are in each case connected to the second outputs such as, e.g., 459 of the multiplexer circuits such as, e.g., of the second multiplexer circuit 451 and to the node 466.

The node 465 is connected to the first connection 414 of the regulating FET 415 and is thus at the reference potential.

The node 466 may be connected to a low potential by means of the connection 456.

The first and second control connections such as, e.g., 452 and 453, and 454 and 455, of the respective multiplexer circuits such as, e.g., 450 and 451 are connected to the control unit 370.

An explanation is given below, by way of example, of the operation of the modified measuring circuit arrangement 1200 according to the first exemplary embodiment illustrated in FIG. 12, with the memory elements 401 being operated in at least two operating modes for reading out and providing the electrical quantities in a manner referred to as voltage integration IV (integration voltage).

In a first operating mode 501 (cf. diagram 500 in FIG. 5) of the driving, the memory element 401 is switched by means of the application of a suitable voltage by means of the control unit 370 to a memory element selection connection 445 via the control gate 406 and a suitable voltage to the first source/drain connection 404 for the first operating mode of the memory element 401 such that, depending on the storage state of the memory element 401, a corresponding current can flow through the memory element 401.

This current through the memory element 401 is driven by the potential difference between the connection 456 at low potential and the node 465 at higher reference potential. In the first operating mode 501, the current flows from the connection 456, through the second output 462 of the first multiplexer circuit 450, through the input 457 of the first multiplexer circuit 450, through the first selection transistor 402 of the second decoder circuit 320, through the memory element 401, through the second selection element 403 of the second decoder circuit 320, through the second multiplexer circuit 451 to the node 465. In this case, the control unit 370 controls both the third connections 411 and 412 of the selection transistors 402 and 403 of the second decoder circuit 320 and the first control connections 452 and 454 and the second control connections 453 and 455 of the first and second multiplexer circuits 450 and 451 synchronously with the driving of the memory cell 401.

In the second operating mode 506 of the memory cell 401, the current flow takes place through the elements described above as in the first operating mode 501 correspondingly in the opposite direction.

Figure 7:
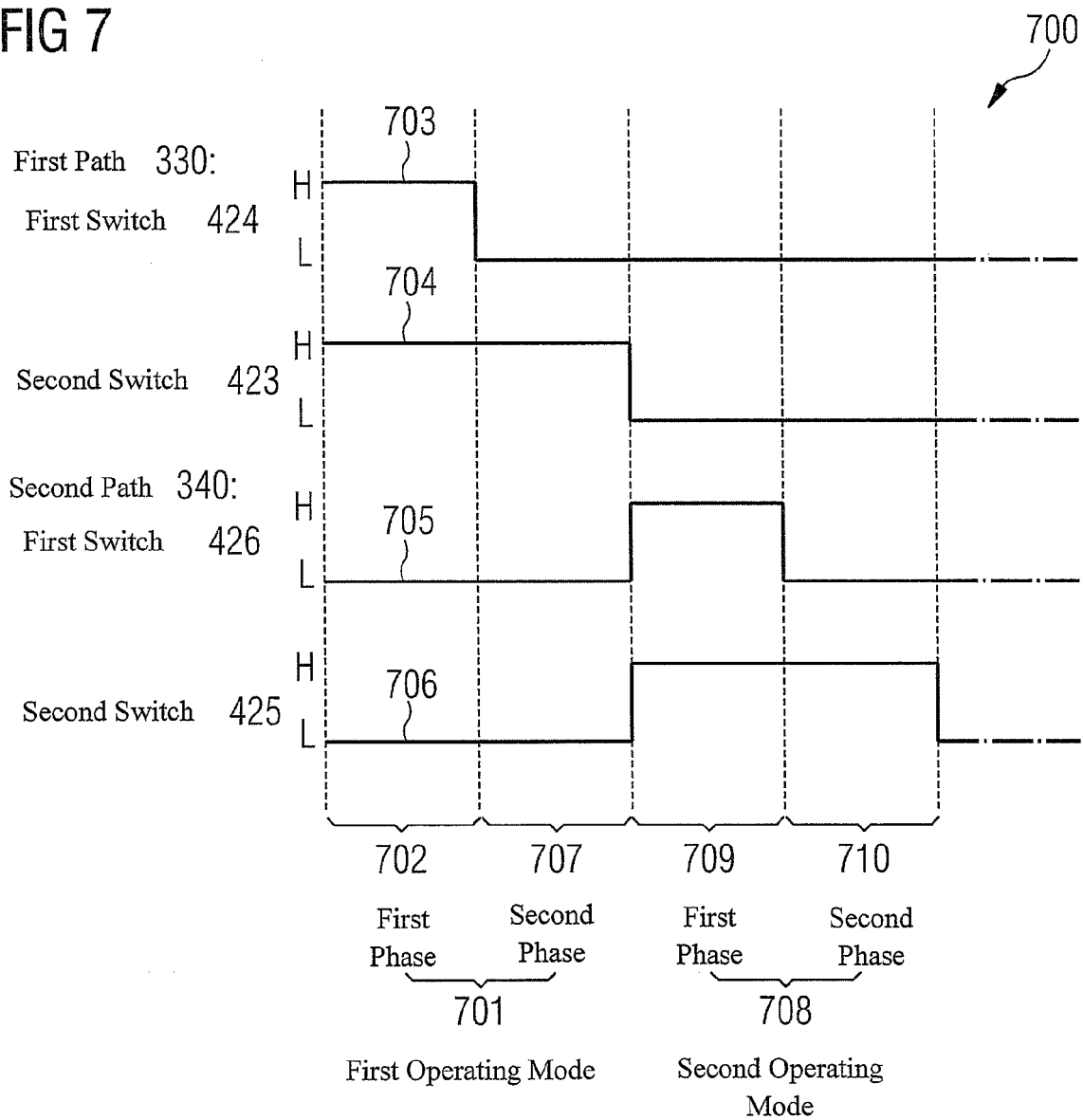
FIG. 7 shows a drive sequence of the electronic measuring circuit arrangement with drain-side sensing in accordance with a second exemplary embodiment of the invention.

FIG. 7 shows, in a diagram 700, the modified driving of a drain-side sensing arrangement 600 in accordance with the second embodiment, by means of the control unit 370 according to FIG. 6.

If, in the first operating mode 701 of the memory element 401, in the first phase 702, both the switching element 424 and the switching element 423 are switched to be conducting "H" (see switching profile 703 of the first switch 424 of the first path 330 and the switching profile 704 of the second switch 423 of the first path 330 in FIG. 7) and the switching elements 425 and 426 are switched to be non-conducting "L" (see switching profile 705 of the first switch 426 of the second path 340 and the switching profile 706 of the second switch 425 of the second path 340 in FIG. 7), the partial storage unit 441 of the first partial circuit path 330 can be charged to the second potential $V_2$.

After the first switching element 424 has been switched to be non-conducting "L" in a second phase 707 of the first operating mode 701 of the memory element 401, the current of the selected memory element 401 will flow via the partial storage unit 441. In this case, a current flows in both operating states 702 and 707.

In the second phase 707, however, the current is fed from the capacitance and leads to a discharge of the capacitance and, consequently, after the end of the second phase 707, the capacitance will assume an electrical state that is characteristic of the charge state of the memory element 401. The electrical state is stored by means of the switching element 423 being switched to be non-conducting at the end of the second phase 707 in the first operating mode 701. FIG. 7 also shows the corresponding symmetrical driving of the switching elements 425 and 426 in a first phase 709 and a second phase 710 of a second operating mode 708 of the memory element 401 in order to pass an electrical quantity of the charge state of the memory element 401 into the second partial circuit path 340 and to store it in the partial storage unit 442.

Figure 9:
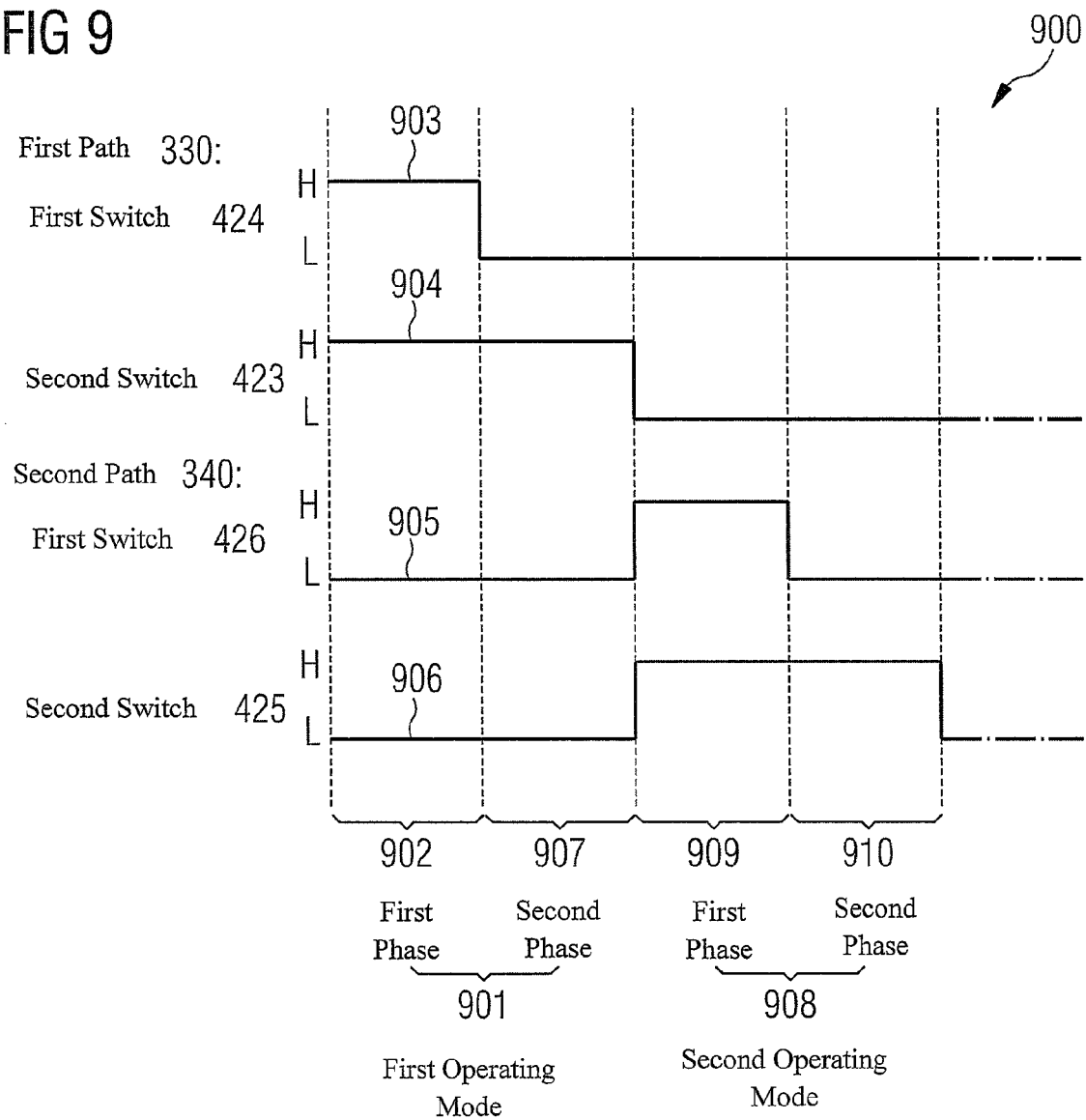
FIG. 9 shows a drive sequence of the electrical circuit arrangement with drain-side sensing in accordance with a third exemplary embodiment of the invention.

FIG. 9 shows, in a diagram 900, the driving of the electronic measuring circuit arrangement 800 with source-side sensing according to FIG. 8. In the first operating mode 901, e.g., of the memory element 401, in the first phase 902 of the driving by means of the control unit 370, the current flow of the memory element 401 is set and the switching elements 423 and 424 of the first partial circuit path 330 are switched to be conducting (see switching profile 903 of the first switch 424 of the first path 330 and the switching profile 904 of the second switch 423 of the first path 330 in FIG. 9) and the switching elements 425 and 426 of the second partial circuit path 340 are switched to be non-conducting (see switching profile 905 of the first switch 426 of the second path 340 and the switching profile 906 of the second switch 425 of the second path 340 in FIG. 9).

In a second phase 907 of the first operating mode 901 of the memory element 401, by means of the switching element 424 being switched to be non-conducting, the source-side current, e.g., of the memory element 401 is fed via the first partial circuit path 330 to the partial storage unit 441. By means of the current flow through the partial storage unit 441 and according to the length of the second phase 907, the electrical quantity that is characteristic of the electrical state, e.g., of the memory element 401 is set in the partial storage unit 441. After the switching element 423 has been switched to be non-conducting by the control unit 370 at the end of the second phase 907 of the first operating mode 901, e.g., of the memory element 401, the electrical state of the partial storage unit 441 is maintained for further electrical processing.

The driving scheme 900 of FIG. 9 also shows how the driving in the first phase 909 and in the second phase 910 of the second operating mode 908, e.g., of the memory element 401 can be effected correspondingly symmetrically in order to provide the electrical quantity resulting from the charge state, e.g., of the memory element 401 for further processing.

In order to simplify the description, the driving schemes, that is to say the profiles of the switch positions, in FIGS. 5, 7 and 9 are illustrated such that alterations of the switching positions of the various switches proceed instantaneously and in a manner perfectly synchronized among one another. However, the circuit according to the invention may equally well be operated with ramped profiles of the alteration of the conductivity of the individual switches. Moreover, unlike what is illustrated by way of example, synchronization of the switching positions of different switches need not be effected instantaneously, rather it may lie within a time window which may result from requirements made of the circuit.

Figure 10:
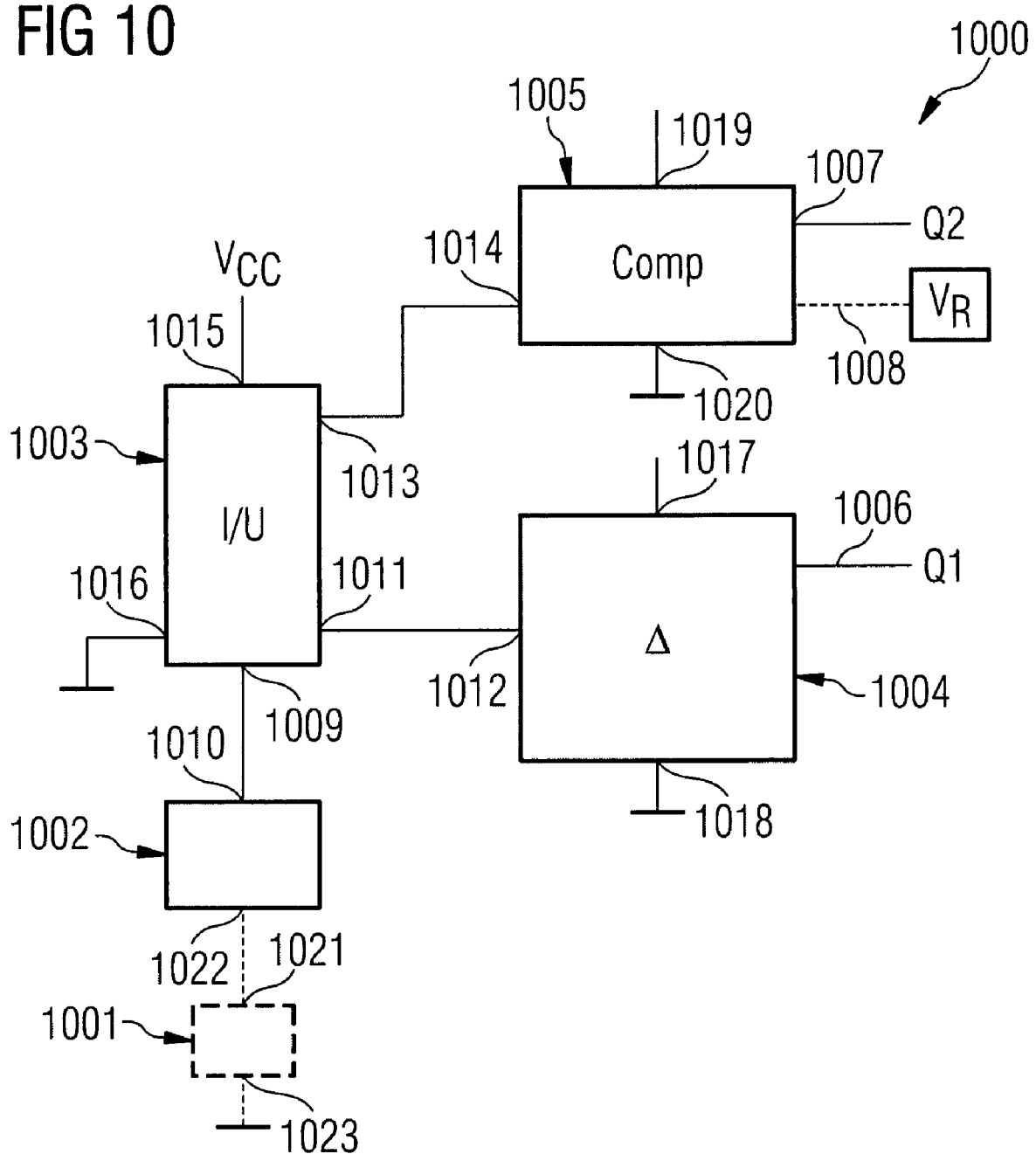
FIG. 10 shows a block diagram of the electronic evaluation circuit arrangement.

FIG. 10 shows a block diagram of an electronic evaluation circuit arrangement 1000 for assessing electrical quantities and providing comparison results, the electrical quantities resulting from the operation of at least one memory element.

The basic circuit of the evaluation circuit arrangement 1000 has a storage unit 1002, a coupling unit 1003 connected to the storage unit 1002 and a first evaluation unit 1004 and a second evaluation unit 1005, both the first evaluation unit 1004 and the second evaluation unit 1005 being connected to the coupling unit 1003.

The storage unit 1002 may be composed of a plurality of partial storage units, so that the sum of the partial storage units suffices to store the at least two electrical quantities.

The storage unit 1002 of the electronic evaluation circuit arrangement 1000 is constructed such that it can be fed, by means of an interface 1022, at least two analog electrical quantities resulting from the operation of at least one memory element 1001, e.g., in two different operating directions. The analog electrical quantities resulting from the at least two operating modes of the memory element 1001 can be read into the storage unit 1002.

By means of the interface 1022 between the memory element 1001 and the storage unit 1002, the electrical quantities resulting from the operating modes of the memory element 1001 can be buffer-stored by means of the storage unit 1002.

The first evaluation unit 1004 has a first output Q1 1006 of the evaluation circuit arrangement 1000 and the second evaluation unit 1005 has a second output Q2 1007 of the evaluation circuit arrangement 1000. The second evaluation unit 1005 may optionally be extended by a connection Vr 1008, to which a reference voltage may be applied.

This first evaluation unit 1004 may be embodied in the form of a comparison circuit, such as, e.g., of a differential amplifier, by virtue of the at least two electrical quantities acting on the inputs of the difference forming circuit in such a way that the output signal of the difference forming circuit constitutes the assessment result.

As an alternative, the first evaluation unit 1004 may also be realized by at least one flip-flop circuit, on the inputs of which the at least two electrical quantities act in such a way that the switching state of the flip-flop assumes one of at least two states depending on the at least two electrical quantities, and, consequently, the associated resulting electrical quantities that occur at suitable nodes of the circuit represent the assessment result.

The flip-flop circuit may be constructed, e.g., by means of two cross-coupled inverter circuits.

The assessment result of the first evaluation unit 1004 is present as a defined level at the output of the first evaluation unit Q1 1006, which is defined by the parameters of the electrical evaluation circuit arrangement 1000, both, e.g., in the embodiment with the difference forming circuit as assessment circuit and, e.g., in the embodiment by means of the flip-flop as assessment circuit.

As a further option, the evaluation circuit arrangement 1000 may be extended by a memory element 1001 and the memory element 1001 is connected to the storage unit 1002.

The first connection 1009 of the coupling unit 1003 is connected to the second connection 1010 of the storage unit 1002. The second connection 1011 of the coupling unit 1003 is connected to the first connection 1012 of the first evaluation unit 1004. The third connection 1013 of the coupling unit 1003 is connected to the first connection 1014 of the second evaluation unit 1005.

The coupling unit 1003 can be connected to a higher potential of a voltage supply by means of the fourth connection 1016, and the coupling unit 1003 can be connected to a lower potential of a voltage supply by means of the fifth connection 1015.

The second connection 1006 of the first evaluation unit 1004 is a first output Q1 of the evaluation circuit arrangement 1000. The third connection 1017 of the first evaluation unit 1004 can be connected to a higher potential of a current supply and the fourth connection 1018 of the evaluation unit 1004 can be connected to a lower potential of a current supply.

The second connection 1007 of the second evaluation unit 1005 is a second output Q2 1007 of the evaluation circuit arrangement 1000. The third connection 1019 of the evaluation unit 1005 can be connected to a higher potential of a current supply and the fourth connection 1020 of the evaluation unit 1005 can be connected to a lower potential of a current supply.

Optionally, the first connection 1021 of a memory element 1001 may be connected to the first input connection 1022 of the storage unit 1002 of the evaluation circuit arrangement 1000. The second connection 1023 of the memory element may be connected to a lower potential of a voltage supply.

The operation of the block circuit 1000 of the evaluation circuit arrangement is explained in more detail below with reference to FIG. 10.

At least one electrical quantity is stored by means of the storage unit 1002, the electrical quantity resulting, e.g., from the operation of a memory element 1001. If this memory element 1001 is operated in a first manner and/or a second manner or further manners, then optionally a second electrical quantity or further electrical quantities is or are also stored in the storage unit 1002.

The coupling unit 1003 converts the at least one electrical quantity into at least one converted electrical quantity that is more suitable for the further operating mode, and feeds the at least one converted electrical quantity to the first evaluation unit 1004 and/or the second evaluation unit 1005. Optionally, the coupling unit 1003 will calculate together at least two electrical quantities or at least two converted electrical quantities with one another in an analog manner before they are fed to the first evaluation unit 1004 and/or the second evaluation unit 1005. As an alternative, the coupling unit 1003 may also be set up such that it couples unconverted quantities and optionally electrical quantities calculated together in an analog manner to the evaluation units.

The first evaluation unit 1004 is coupled to the storage unit 1002 and is set up in such a way that it assesses the at least two analog electrical quantities and provides a first assessment result at the output connection Q1 1006.

The first evaluation unit 1004 assesses the at least two converted or alternatively of the unconverted electrical quantities by comparing the first converted electrical quantity and the second converted electrical quantity in terms of the absolute value and, depending on which of the converted electrical quantities is greater, putting the first output Q1 1006 of the evaluation circuit arrangement 1000 either to a high electrical level or a low electrical level. By means of the magnitude of this defined electrical level, the first evaluation unit 1004 provides the first assessment result at the output of the evaluation circuit arrangement 1000.

The second evaluation unit 1005 assesses at least one of the converted or alternatively the unconverted electrical quantities and/or at least one electrical quantity calculated together from the converted or alternatively the unconverted electrical quantities in an analog manner by assessing them with a threshold value.

The threshold value may be predetermined by a trigger circuit arrangement of the second evaluation circuit 1005 or be predetermined by a voltage at the connection 1008 for the reference potential.

Depending on whether the at least one converted electrical quantity or the at least one electrical quantity calculated together from the converted electrical quantities in an analog manner is less than or greater than the threshold value, the second output Q2 1007 of the evaluation circuit arrangement 1000 is put either to a high electrical level or a low electrical level. By means of the magnitude of this defined electrical level, the second evaluation unit 1005 provides the second assessment result.

By modifying parts of the circuit arrangement, e.g., of the coupling unit 1003, in a form such that the electrical quantity is fed to the second evaluation unit 1005 only from a partial storage unit of the storage unit 1002, the second evaluation unit 1005 can assess the comparison result of one of the at least two electrical quantities or, by means of a second modification of the circuit arrangement by forming, e.g., the sum of the electrical quantities, e.g., by means of the coupling unit 1003, electrical quantities derived from the at least two electrical quantities of the storage unit 1002 can be assessed.

The modifications of the coupling unit for forming analog electrical quantities from the at least two electrical quantities of the storage unit and the feeding of the electrical quantities from the storage unit to the evaluation units depend on the advantageous operating mode of the memory element and can easily be adapted correspondingly.

The threshold value or trigger point of the second evaluation unit 1005 can be set by the electrical parameters of a trigger circuit if, e.g., a Schmitt trigger is used for the assessment circuit. If a differential circuit is used for the assessment circuit, the threshold value or the trigger point may be fed by the reference voltage or comparison voltage at the connection 1008 of the second evaluation circuit 1005 and be set by means of one of the at least two inputs of a differential circuit.

The at least one converted electrical quantity, which is assessed by the second evaluation circuit 1005 by means of a differential circuit, is fed to a first input of the at least two inputs of the differential circuit and the reference voltage is fed to the second input of the differential circuit. The voltage level at the output of the differential circuit then defines the assessment result by means of the comparison of the two voltages, which assessment result is thus provided and is coupled to the output Q2 1007 of the second evaluation circuit.

Since the electrical quantity stored in the storage unit 1002 is coupled both to the first evaluation unit 1004 and to the second evaluation unit 1005, the assessment result can be effected simultaneously with regard to the assessment criteria of the first evaluation unit 1004 and of the second evaluation unit 1005. The first assessment result and the second assessment result are thus present simultaneously in digitized form at the output Q1 1006 of the first evaluation circuit 1004 and at the output Q2 1007 of the second evaluation circuit 1005. Due to the simultaneous assessment according to this method, the assessment result is more robust with respect to alterations in the voltage supply or the reference voltages.

Figure 11:
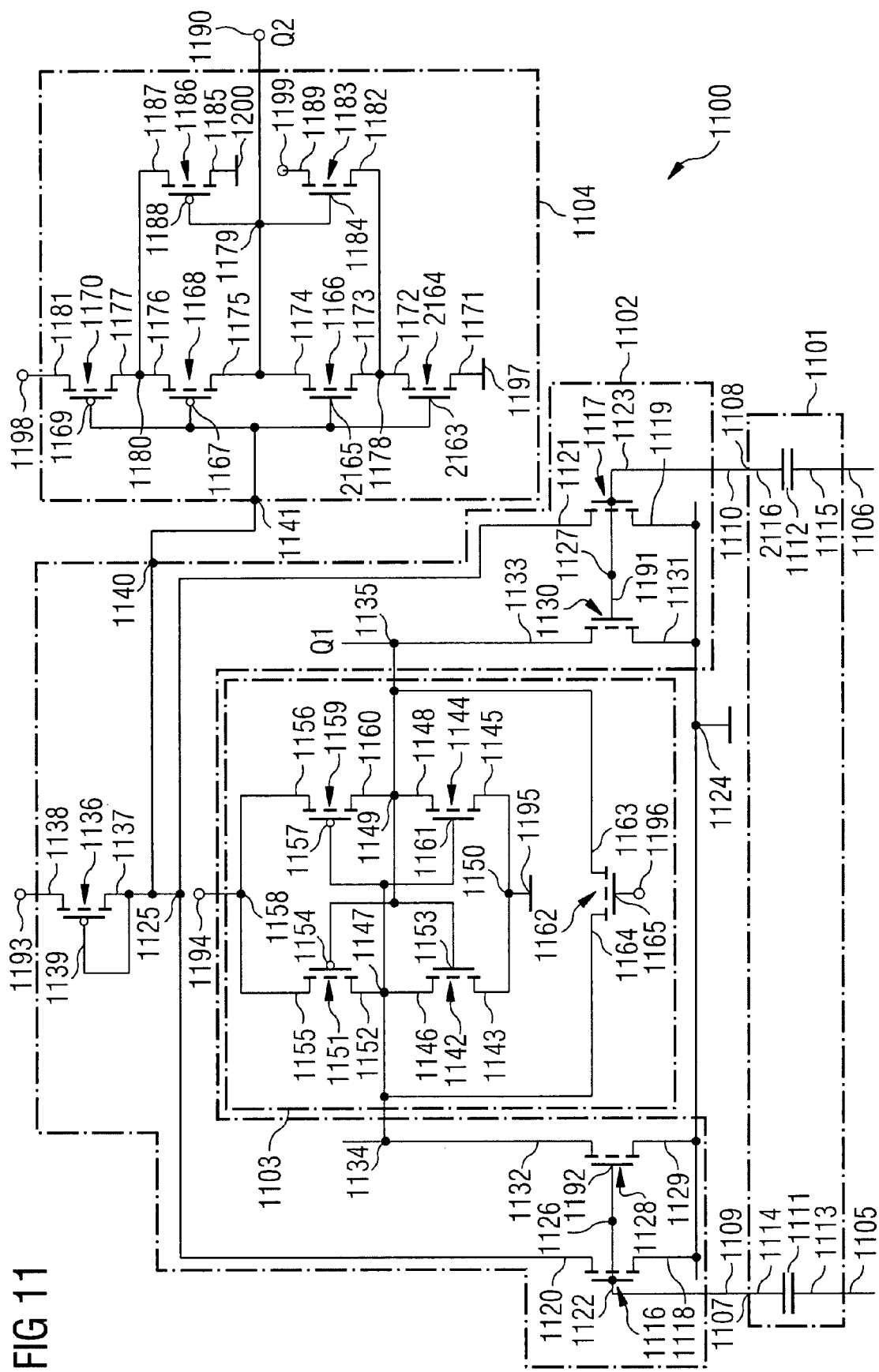
FIG. 11 shows an electronic evaluation circuit arrangement in accordance with one exemplary embodiment of the invention.

FIG. 11 shows an exemplary embodiment of the evaluation circuit arrangement 1100 of the schematic evaluation circuit arrangement 1000 from FIG. 10.

As is illustrated in FIG. 11 an exemplary embodiment 1100 of the schematic evaluation circuit arrangement 1000 has four circuit units: a storage unit 1101, a coupling unit 1102, a first evaluation unit 1103 and a second evaluation unit 1104.

The storage unit 1101 has a first connection 1105 and a second connection 1106, which can in each case be connected by a memory element. The third connection 1107 of the storage unit 1101 is connected to the first connection 1109 of the coupling unit 1102. The fourth connection 1108 of the storage unit 1101 is connected to the second connection 1110 of the coupling unit 1102.

In the evaluation circuit arrangement 1100 as an embodiment of the evaluation circuit arrangement 1000, the first connection 1113 of the first capacitor 1111 is connected to the first connection 1105 of the storage unit 1101. The second connection 1114 of the first capacitor 1111 is connected to the third connection 1107 of the storage unit 1101.

The first connection 1115 of the second capacitor 1112 is connected to the second connection 1106 of the storage unit 1101.

The second connection 2116 of the capacitor 1112 is connected to the fourth connection 1108 of the storage unit 1101.

The coupling unit 1102 of the exemplary embodiment 1100 of the evaluation circuit arrangement 1000 has at least four field effect transistors 1116, 1117, 1128, 1130, each having three connections and an FET 1136 connected as a diode.

The first connection 1118 of the first field effect transistor 1116 and the first connection 1119 of the second field effect transistor 1117 are connected to the first node 1124. The second connection 1120 of the first field effect transistor 1116 and the second connection 1121 of the second field effect transistor 1117 are connected to the second node 1125.

The third connection 1122 of the first field effect transistor 1116 is connected both to the third node 1126 and to the first connection 1109 of the coupling unit 1102. The third connection 1123 of the second field effect transistor 1117 is connected both to the fourth node 1127 and to the second connection 1110 of the coupling unit 1102.

The first connection 1129 of the third field effect transistor 1128 and the first connection 1131 of the fourth field effect transistor 1130 are connected to the first node 1124.

The second connection 1132 of the third field effect transistor 1128 is connected to the first connection 1134 of the first evaluation unit 1103. The second connection 1133 of the fourth field effect transistor 1130 is connected to the second connection 1135 of the first evaluation unit 1103. The third connection 1192 of the third field effect transistor 1128 is connected to the third node 1126 and the third connection 1191 of the fourth field effect transistor 1130 is connected to the fourth node 1127.

The third connection 1139 of the fifth field effect transistor 1136 and the first connection 1137 of the fifth field effect transistor 1136 are connected to the second node 1125. The second connection 1138 of the fifth field effect transistor 1136 is connected to the fourth connection 1193 of the coupling unit 1102 and a high potential of the operating voltage can be applied to the fourth connection 1193 of the coupling unit 1102. The third connection 1140 of the coupling unit 1102 is connected to the first connection 1141 of the second evaluation unit 1104.

The first evaluation unit 1103 of the evaluation circuit arrangement has at least four further field effect transistors 1142, 1144, 1151, 1159. Optionally, the first evaluation unit 1103 may additionally be extended by a fifth field effect transistor 1162.

The first connection 1143 of the first field effect transistor 1142 of the first evaluation unit 1103 and the first connection 1145 of the second field effect transistor 1144 of the first evaluation unit 1103 are connected to the first node 1150 of the first evaluation unit 1103. The second connection 1146 of the first field effect transistor 1142 of the first evaluation unit 1103 and the first connection 1152 of the third field effect transistor 1151 are connected to the second node 1147 of the first evaluation unit 1103.

The third connection 1153 of the first field effect transistor 1142 of the first evaluation unit 1103 and the third connection 1154 of the third field effect transistor 1151 of the first evaluation unit 1103 are connected to the third node 1149 of the first evaluation unit 1103. The second connection 1155 of the third field effect transistor 1151 of the first evaluation unit 1103 and the second connection 1156 of the fourth field effect transistor 1159 of the first evaluation unit 1103 are connected to the fourth node 1158 of the first evaluation unit 1103.

The second connection 1148 of the second field effect transistor 1144 of the first evaluation unit 1103 and the first connection 1160 of the fourth field effect transistor 1159 are connected to the third node 1149 of the first evaluation unit 1103.

The third connection 1161 of the second field effect transistor 1144 of the first evaluation unit 1103 and the third connection 1157 of the fourth field effect transistor 1159 of the first evaluation unit 1103 are connected to the second node 1147 of the first evaluation unit 1103.

The first output Q1 1135 of the first evaluation unit 1103 is connected to the third node 1149 of the first evaluation unit 1103.

The fourth node 1158 can be connected to a higher potential of the voltage supply at the connection 1194. The first node 1150 of the first evaluation unit 1103 can be connected to a lower potential of the voltage supply at the connection 1195.

Optionally, the first connection 1163 of the optional fifth field effect transistor 1162 of the first evaluation unit 1103 is connected to the third node 1149 of the first evaluation unit 1103, and the second connection 1164 of the optional fifth field effect transistor 1162 is connected to the second node 1147 of the first evaluation unit 1103. The third connection 1165 of the optional fifth field effect transistor 1162 can be connected to a control unit at the connection 1196.

The second evaluation unit 1104 of the electronic evaluation circuit arrangement 1100 has at least six field effect transistors 2164, 1166, 1168, 1170, 1183 and 1186. The third connection 2163 of the first field effect transistor 2164 of the second evaluation unit 1104 and the third connection 2165 of the second field effect transistor 1166 of the second evaluation unit 1104 and the third connection 1167 of the third field effect transistor 1168 of the second evaluation unit 1104 and the third connection 1169 of the fourth field effect transistor 1170 of the second evaluation unit 1104 are connected to one another and to the first connection 1141 of the second evaluation unit 1104. The first connection 1141 of the second evaluation unit 1104 is connected to the third connection 1140 of the coupling unit 1102 and the second node 1125 of the coupling unit 1102.

The first connection 1171 of the first field effect transistor 2164 of the second evaluation unit 1104 can be connected to a low potential of the voltage supply by means of the connection 1197.

The second connection 1172 of the first field effect transistor 2164 of the second evaluation unit 1104 and the first connection 1173 of the second field effect transistor 1166 of the second evaluation unit 1104 are connected to the node 1178 of the second evaluation unit 1104.

The second connection 1174 of the second field effect transistor 1166 of the second evaluation unit 1104 and the first connection 1175 of the third field effect transistor 1168 of the second evaluation unit 1104 are connected to the second node 1179 of the second evaluation unit 1104.

The second connection 1176 of the third field effect transistor 1168 of the second evaluation unit 1104 and the first connection 1177 of the fourth field effect transistor 1170 of the second evaluation unit 1104 are connected to the third node 1180 of the second evaluation unit 1104.

The second connection 1181 of the fourth field effect transistor 1170 of the second evaluation unit 1104 can be connected to a higher potential of the supply voltage at the connection 1198.

The first connection 1182 of the fifth field effect transistor 1183 of the second evaluation unit 1104 is connected to the first node 1178 of the second evaluation unit 1104. The second connection 1189 of the fifth field effect transistor 1183 of the second evaluation unit 1104 can be connected to a higher potential of the voltage supply at the connection 1199.

The third connection 1184 of the fifth field effect transistor 1183 of the second evaluation unit 1104 and the third connection 1188 of the sixth field effect transistor 1186 are connected to the second node 1179 of the second evaluation unit 1104. The first connection 1185 of the sixth field effect transistor 1186 of the second evaluation unit 1104 can be connected to a lower potential of the voltage supply at the connection 1200.

The second connection 1187 of the sixth field effect transistor 1186 of the second evaluation unit 1104 is connected to the third node 1180 of the second evaluation unit 1104.

The output Q2 1190 of the circuit arrangement 1100 is connected to the second node 1179 of the second evaluation unit 1104.

The operation and the optional driving of the electronic evaluation circuit arrangement 1100 according to the exemplary embodiment of the schematic evaluation circuit arrangement 1000 as illustrated in FIG. 11 are explained by way of example below:

The first electrical quantity is present in the form of a first storage voltage between the first connection 1113 and the second connection 1114 of the first capacitor 1111 of the storage unit 1101.

The first storage voltage acts on the first input 1109 of the coupling unit 1102 which first input is connected to the gate connection 1122 of the first input FET (field effect transistor) 1116 of the coupling unit 1102. The first input FET 1116 of the coupling unit 1102 acts as a voltage-current converter.

The second electrical quantity is present in the form of a second storage voltage between the first connection 1115 and the second connection 2116 of the second capacitor 1112 of the storage unit 1101.

The second storage voltage acts on the second input 1110 of the coupling unit 1102, the second input being connected to the gate connection 1123 of the second input FET 1117. The second input FET 1117 acts as a voltage-current converter.

The current through the first input FET 1116 and the current through the second input FET 1117 of the coupling unit 1102 are added at the node 1125 to form a summation current and, by means of the FET 1136 that is connected as a diode and acts as a current-voltage converter, the node 1125 is at a summation potential dependent on the summation current. In this case, the summation voltage may possibly deviate from an arithmetic sum as a result of non-linearities of the conversion.

The summation voltage acts on the input connection 1141 of the second evaluation circuit 1104. Therefore, the summation voltage acts on the third connections 2163, 2165, 1167 and 1169 of the input FETs 2164, 1166, 1168 and 1170 of the second evaluation circuit 1104. These input transistors 2164, 1166, 1168 and 1170 form, together with the field effect transistors 1183 and 1186, a Schmitt trigger that serves as a comparison circuit in this exemplary embodiment.

According to the parameters of the circuit construction of this Schmitt trigger, the node 1179 of the second evaluation circuit 1104 is put to a high potential or a low potential depending on whether the summation input voltage is higher or lower than the trigger voltage of the Schmitt trigger. This result is stored on account of the properties of the Schmitt trigger until the next measurement cycle being represented by a corresponding potential at the node 1179.

Since the node 1179 is connected to the output connection Q2 1190, the latter is thus put to a high potential or a low potential depending on the magnitude of the summation input voltage of the second evaluation circuit 1104.

The first storage voltage of the first capacitor 1111 of the storage unit 1101 also acts on the third FET 1128 of the coupling unit 1102, which acts as a current-voltage converter.

The current resulting from the voltage at the second connection 1132 of the third FET 1128 acts on the first connection 1134 of the first evaluation circuit 1103.

The first evaluation circuit 1103 has two inverters connected in cross-coupled fashion as a flip-flop. The first inverter is formed from the first FET 1142 of the first evaluation circuit 1103 and the third FET 1151 of the first evaluation circuit 1103.

The second inverter is formed from the second FET 1144 of the first evaluation circuit 1103 and the fourth FET 1159 of the first evaluation circuit 1103.

The second storage voltage of the second capacitor 1112 acts on the third connection 1191 of the fourth FET 1130 of the coupling unit 1102, which acts as a current-voltage converter. The current of the fourth FET 1130 acts on the second connection 1135 of the first evaluation unit 1103 and thus on the third node 1149 of the first evaluation unit 1103.

Optionally, for the activation of the first evaluation unit 1103 by means of the fifth FET 1162 by a control unit that is coupled to the connection 1196 of the first evaluation unit 1103 and acts on the third connection 1165 of the fifth FET 1162, the potential of the second node 1147 and of the third node 1149 can be put to a common value for a predetermined time. This makes it possible for the flip-flop to switch reliably.

After this optional activation of the first evaluation unit 1103, according to the value of the current at the first input connection 1134 of the first evaluation unit 1103 in comparison with the value of the current at the second input connection 1135 of the first evaluation unit 1103, the flip-flop will assume its first or its second state and thus puts either the second node 1147 or the third node 1149 to a higher potential.

The magnitude of the potential at the second connection 1135, which also constitutes the output Q1 of the first evaluation circuit 1103, thus characterizes the assessment result of the first evaluation circuit 1103. On account of the inherent properties of a flip-flop circuit, the potential of the first connection 1134 of the first evaluation unit 1103 alternatively constitutes the inverse assessment result.

These results are stored until the next measurement cycle on account of the properties of the flip-flop.

What is claimed is:

1. An electronic circuit arrangement, comprising:
a storage unit set up for storing at least two analog electrical signals representative of electrical quantities;
a first evaluation circuit coupled to the storage unit, said first evaluation circuit being set up in such a way that it assesses the at least two analog electrical signals and provides a first assessment result, wherein the first evaluation circuit is set up in such a way that it sets a defined electrical level depending on a result of the difference between the at least two analog electrical signals at an output; and
a second evaluation circuit coupled to the storage unit, said second evaluation circuit being set up in such a way that it assesses at least one of the at least two analog electrical signals with a predetermined threshold value and provides a second assessment result.

2. The electronic circuit arrangement according to claim 1, wherein the first assessment result and/or the second assessment result are/is provided in digitized form.

3. The electronic circuit arrangement according to claim 1, wherein the assessment result of the first evaluation circuit and the assessment result of the second evaluation circuit are provided simultaneously.

4. The electronic circuit arrangement according to claim 1, wherein the storage unit includes at least two capacitors.

5. The electronic circuit arrangement according to claim 1, wherein the second evaluation circuit is set up in such a way that it assesses a sum or at least one of an individual value of the at least two analog electrical signals with the predetermined threshold value.

6. The electronic circuit arrangement according to claim 1, wherein the second evaluation circuit is set up in such a way that the predetermined threshold value is adjustable.

7. The electronic circuit arrangement according to claim 1, wherein the first evaluation circuit includes at least two inverter circuits.

8. The electronic circuit arrangement according to claim 1, wherein the first evaluation circuit includes at least one difference forming circuit.

9. The electronic circuit arrangement according to claim 1, wherein the storage unit has an interface for feeding the at least two analog electrical signals that result from operation of at least one memory element.

10. The electronic circuit arrangement according to claim 1, further comprising at least one memory element coupled to the storage unit and set up in such a way that the at least two analog electrical signals result from operation of the at least one memory element.

11. An electronic circuit arrangement, comprising:
a storage unit set up for storing at least two analog electrical signals representative of electrical quantities;
a first evaluation circuit coupled to the storage unit, said first evaluation circuit being set up in such a way that it assesses the at least two analog electrical signals and provides a first assessment result; and
a second evaluation circuit coupled to the storage unit, said second evaluation circuit being set up in such a way that it assesses at least one of the at least two analog electrical signals with a predetermined threshold value and provides a second assessment result;
wherein the second evaluation circuit includes a comparison circuit with an adjustable trigger point that is set up in such a way that the assessment result of the at least one of the at least two analog electrical signals is determined with a trigger point.

12. The electronic circuit arrangement according to claim 11, wherein the comparison circuit of the second evaluation circuit has at least one Schmitt trigger.

13. The electronic circuit arrangement according to claim 11, wherein the comparison circuit of the second evaluation circuit has at least one difference forming circuit.

14. An electronic circuit arrangement, comprising:
a storage unit set up for storing at least two analog electrical signals representative of electrical quantities;
a first evaluation circuit coupled to the storage unit, said first evaluation circuit being set up in such a way that it assesses the at least two analog electrical signals and provides a first assessment result;
a second evaluation circuit coupled to the storage unit, said second evaluation circuit being set up in such a way that it assesses at least one of the at least two analog electrical signals with a predetermined threshold value and provides a second assessment result; and
a coupling unit, wherein the storage unit is coupled to at least one evaluation circuit by means of the coupling unit and the coupling unit is set up in such a way that further electrical signals can be formed by means of the at least two analog electrical signals.

15. The electronic circuit arrangement according to claim 14, wherein the coupling unit is set up in such a way that both a sum and individual values of the at least two analog electrical signals of the storage unit can be formed and it may be coupled to at least one evaluation circuit.

16. A method for determining a state of a storage unit in which at least two analog electrical signals representative of electrical quantities are stored, the method comprising:
using a first evaluation circuit to assess a difference between the at least two analog electrical signals and provide at least one first assessment result; and
using a second evaluation circuit to assess at least one of the at least two analog electrical signals with respect to a threshold value and provide at least one second assessment result;
wherein the assessment of the at least two analog electrical signals is performed simultaneously with aid of the first evaluation circuit and the second evaluation circuit.

17. The method according to claim 16, wherein the first assessment result and the second assessment result represent the state of the storage unit and the first assessment result and the second assessment result are provided in digitized form.

18. The method according to claim 16, wherein, in order to determine the state of the storage unit, at least one electrical quantity stored by means of a capacitor is assessed by the first evaluation unit and/or by the second evaluation unit.

19. The method according to claim 16, wherein, with the aid of the second assessment circuit, a sum or at least one individual value of the at least two analog electrical signals is assessed with a threshold value.

20. The method according to claim 16, wherein the threshold value for the assessment by means of the second evaluation circuit is predetermined by means of an assessment circuit interface.

21. The method according to claim 16, wherein the assessment of the at least two analog electrical signals with aid of the second evaluation circuit is performed by means of an adjustable trigger point of the second evaluation circuit.

22. The method according to claim 16, wherein at least one Schmitt trigger is used for the second evaluation circuit.

23. The method according to claim 16, wherein at least one difference forming circuit is used for the assessment with aid of the second assessment circuit.

24. The method according to claim 16, wherein at least two inverter circuits are used for the assessment with aid of the first evaluation circuit.

25. The method according to claim 16, wherein at least two analog electrical signals resulting from operation of at least one memory element are read into the storage unit.

26. The method according to claim 16, wherein at least one difference forming circuit is used for the assessment with aid of the first evaluation circuit.

27. The method according to claim 16, wherein, by means of a coupling unit coupled both to the storage unit and to at least one evaluation circuit, further electrical signals are formed from the at least two analog electrical signals of the storage unit before they are fed to the first evaluation circuit or to the second evaluation circuit for assessment.

28. The method according to claim 27, wherein a sum of the electrical signals is formed from the at least two analog electrical signals of the storage unit by means of the coupling unit.

29. An electronic circuit arrangement, comprising:
a non-volatile memory element having a state that is represented by at least two electrical quantities;
a storage unit set up for storing at least two analog electrical quantities and coupled to the non-volatile memory element;
a first evaluation circuit coupled to the storage unit, said first evaluation circuit being set up in such a way that it compares the at least two analog electrical quantities with one another and provides a first comparison result in digitized form; and
a second evaluation circuit coupled to the storage unit, said second evaluation circuit being set up in such a way that it assesses at least one of the at least two analog electrical quantities with a predetermined threshold value and provides a second comparison result in digitized form simultaneously with the first comparison result.

* * * * *